(12) United States Patent
Korenaga

(10) Patent No.: US 7,075,198 B2
(45) Date of Patent: Jul. 11, 2006

(54) ALIGNMENT APPARATUS AND EXPOSURE APPARATUS USING THE SAME

(75) Inventor: Nobushige Korenaga, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/178,568

(22) Filed: Jul. 12, 2005

(65) Prior Publication Data

US 2005/0248219 A1    Nov. 10, 2005

Related U.S. Application Data

(62) Division of application No. 10/735,650, filed on Dec. 16, 2003.

(30) Foreign Application Priority Data

| Dec. 27, 2002 | (JP) | ............................. 2002-382495 |
| Apr. 28, 2003 | (JP) | ............................. 2003-123832 |

(51) Int. Cl.
   *H02K 41/02* (2006.01)
(52) U.S. Cl. ....................................................... 310/12
(58) Field of Classification Search .................. 310/12
   See application file for complete search history.

(56) References Cited

U.S. PATENT DOCUMENTS

| 5,565,747 | A | * | 10/1996 | Sasaki et al. ................ 315/507 |
| 5,684,856 | A | | 11/1997 | Itoh et al. ...................... 378/34 |
| 5,841,250 | A | | 11/1998 | Korenaga et al. ........... 318/135 |
| 5,886,432 | A | * | 3/1999 | Markle ......................... 310/12 |
| 6,002,465 | A | | 12/1999 | Korenaga ..................... 355/53 |
| 6,037,680 | A | | 3/2000 | Korenaga et al. ............. 310/12 |
| 6,072,251 | A | | 6/2000 | Markle ......................... 310/12 |
| 6,107,703 | A | | 8/2000 | Korenaga ..................... 310/12 |
| 6,114,781 | A | * | 9/2000 | Hazelton et al. .............. 310/12 |
| 6,128,069 | A | | 10/2000 | Korenaga ..................... 355/53 |

(Continued)

FOREIGN PATENT DOCUMENTS

JP    56-19606    2/1981

(Continued)

OTHER PUBLICATIONS

European Search Report dated Jul. 13, 2004, issued in corresponding European patent application No. EP 03 25 8183, forwarded in a Communication dated Jul. 19, 2004.

*Primary Examiner*—Joseph Waks
(74) *Attorney, Agent, or Firm*—Fitzpatrick, Cella, Harper & Scinto

(57) ABSTRACT

An exposure apparatus that includes a first movable stage which holds a first wafer and aligns the first wafer at a predetermined position, a second movable stage which holds a second wafer and aligns the second wafer at a predetermined position, first stator coils for driving in a first direction one of the first and second movable stages located in a measurement region for measuring an exposure result, second stator coils for driving the other of the first and second movable stages located in an exposure region for performing exposure in the first direction independently of the movable stage in the measurement region, third stator coils for independently driving the first and second movable stages in a second direction perpendicular to the first direction, and a current control device for supplying to the first to third stator coils control currents having phase differences to generate driving forces between movable element magnets of the first and second movable stages and the stator coils facing the movable element magnets.

12 Claims, 30 Drawing Sheets

U.S. PATENT DOCUMENTS

| | | | |
|---|---|---|---|
| 6,144,119 A * | 11/2000 | Hazelton | 310/12 |
| 6,147,421 A | 11/2000 | Takita et al. | 310/12 |
| 6,172,738 B1 | 1/2001 | Korenaga et al. | 355/53 |
| 6,177,978 B1 | 1/2001 | Korenaga | 355/53 |
| 6,188,147 B1 | 2/2001 | Hazelton et al. | 310/12 |
| 6,208,045 B1 | 3/2001 | Hazelton et al. | 310/12 |
| 6,265,793 B1 | 7/2001 | Korenaga | 310/12 |
| 6,285,097 B1 | 9/2001 | Hazelton et al. | 310/12 |
| 6,316,849 B1 * | 11/2001 | Konkola et al. | 310/12 |
| 6,320,645 B1 | 11/2001 | Inoue et al. | 355/53 |
| 6,323,567 B1 | 11/2001 | Hazelton et al. | 310/12 |
| 6,339,266 B1 | 1/2002 | Tanaka | 310/12 |
| 6,359,677 B1 | 3/2002 | Itoh et al. | 355/53 |
| 6,414,742 B1 | 7/2002 | Korenaga et al. | 355/53 |
| 6,441,514 B1 | 8/2002 | Markle | 310/12 |
| 6,445,093 B1 * | 9/2002 | Binnard | 310/12 |
| 6,479,991 B1 | 11/2002 | Korenaga | 324/226 |
| 6,570,645 B1 | 5/2003 | Korenaga et al. | 355/75 |
| 6,650,079 B1 | 11/2003 | Binnard | 318/649 |
| 6,661,127 B1 | 12/2003 | Frissen et al. | 310/12 |
| 6,791,214 B1 | 9/2004 | Korenaga | 310/12 |
| 6,847,134 B1 | 1/2005 | Frissen et al. | 310/12 |
| 2002/0079888 A1 | 6/2002 | Frissen et al. | 324/207.2 |
| 2002/0096946 A1 | 7/2002 | Bisschops | 310/58 |
| 2003/0007140 A1 | 1/2003 | Korenaga | 355/72 |
| 2003/0098966 A1 | 5/2003 | Korenaga et al. | 355/75 |
| 2003/0102723 A1 | 6/2003 | Korenaga | 310/12 |
| 2003/0179359 A1 | 9/2003 | Korenaga | 355/75 |

FOREIGN PATENT DOCUMENTS

| | | |
|---|---|---|
| JP | 8-6642 | 1/1996 |

* cited by examiner

116a

116b

FIG. 5A
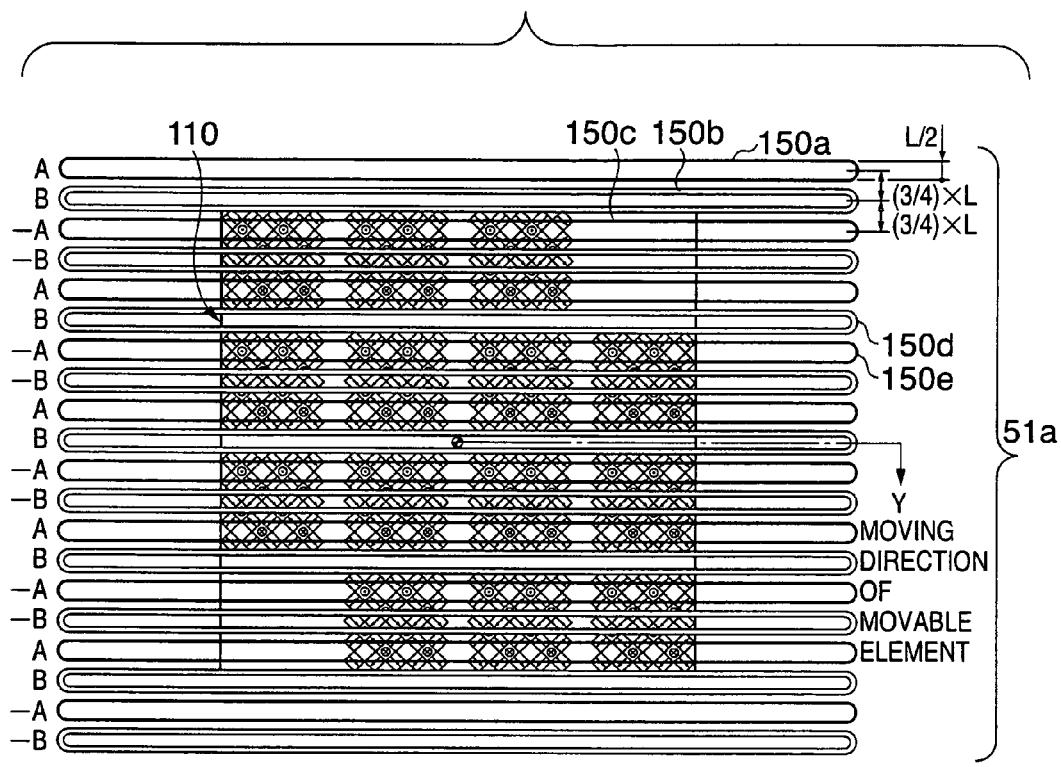
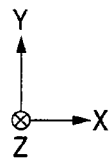
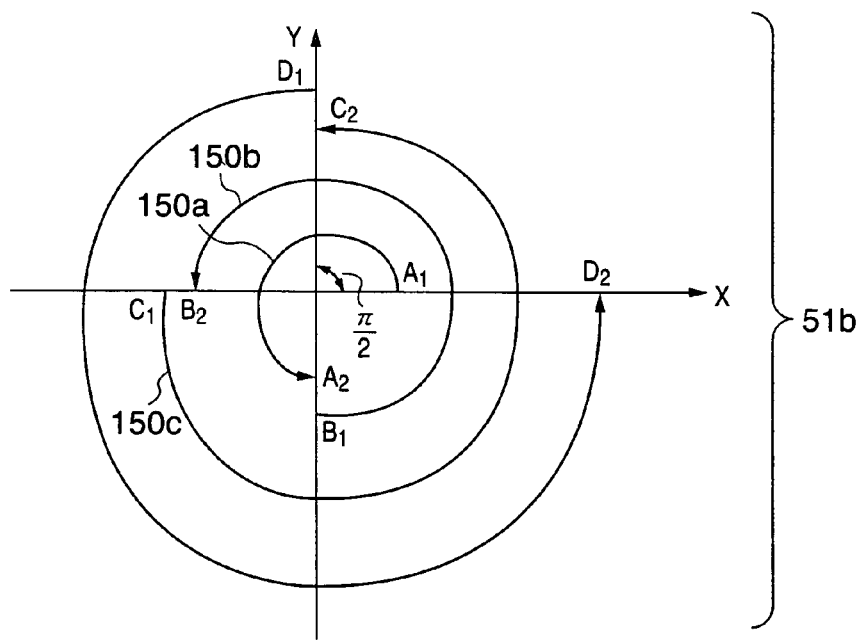

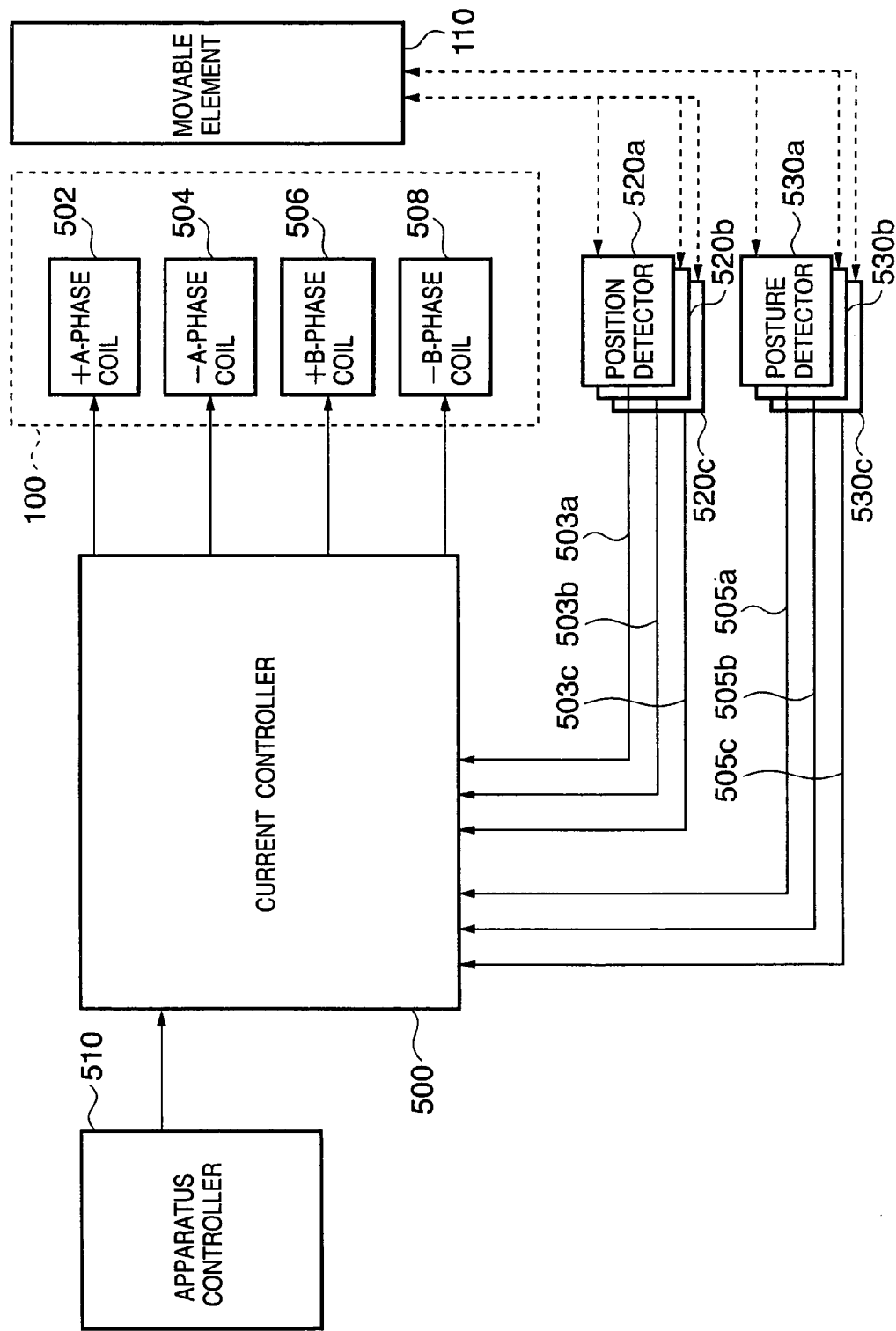

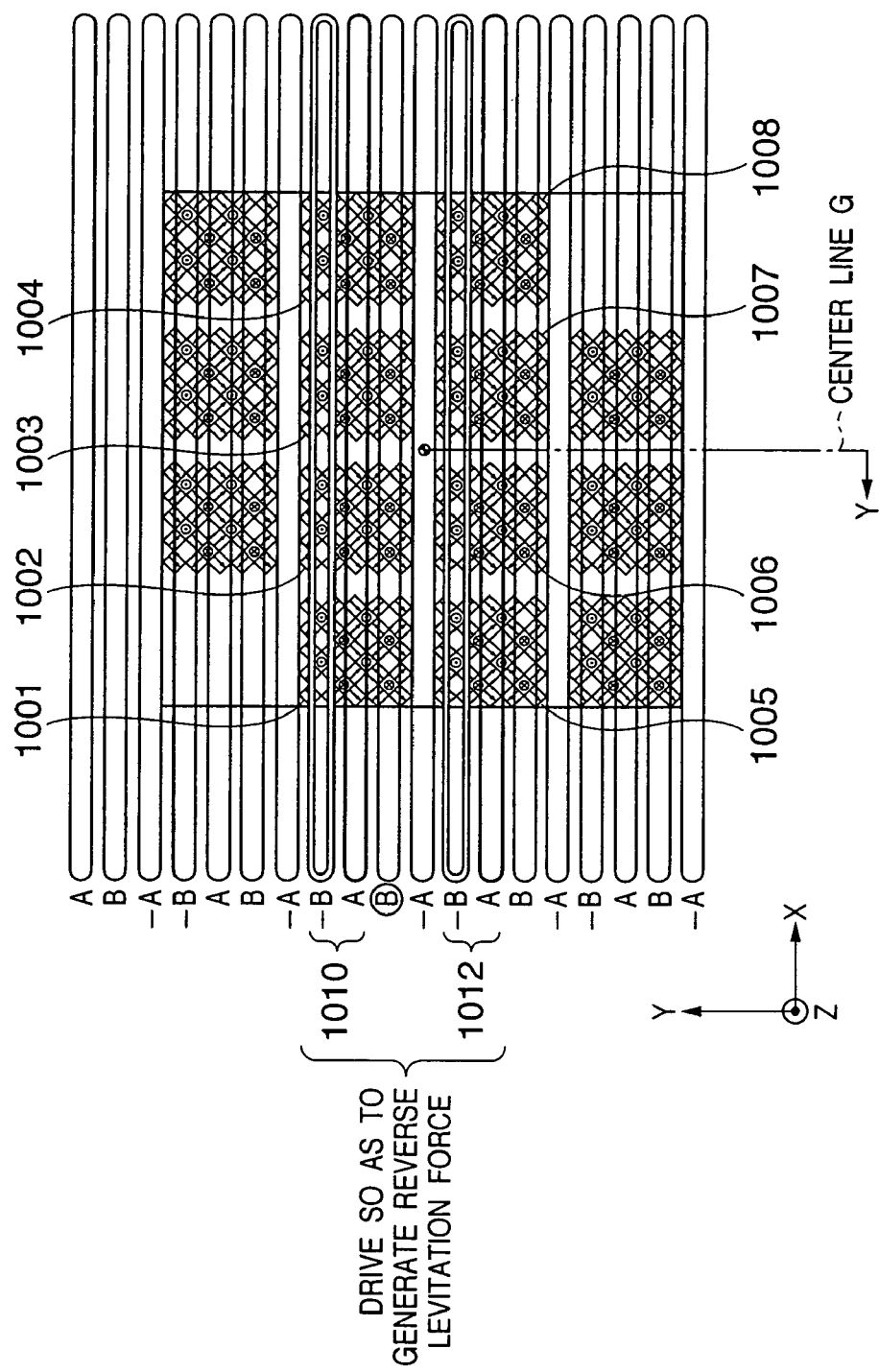

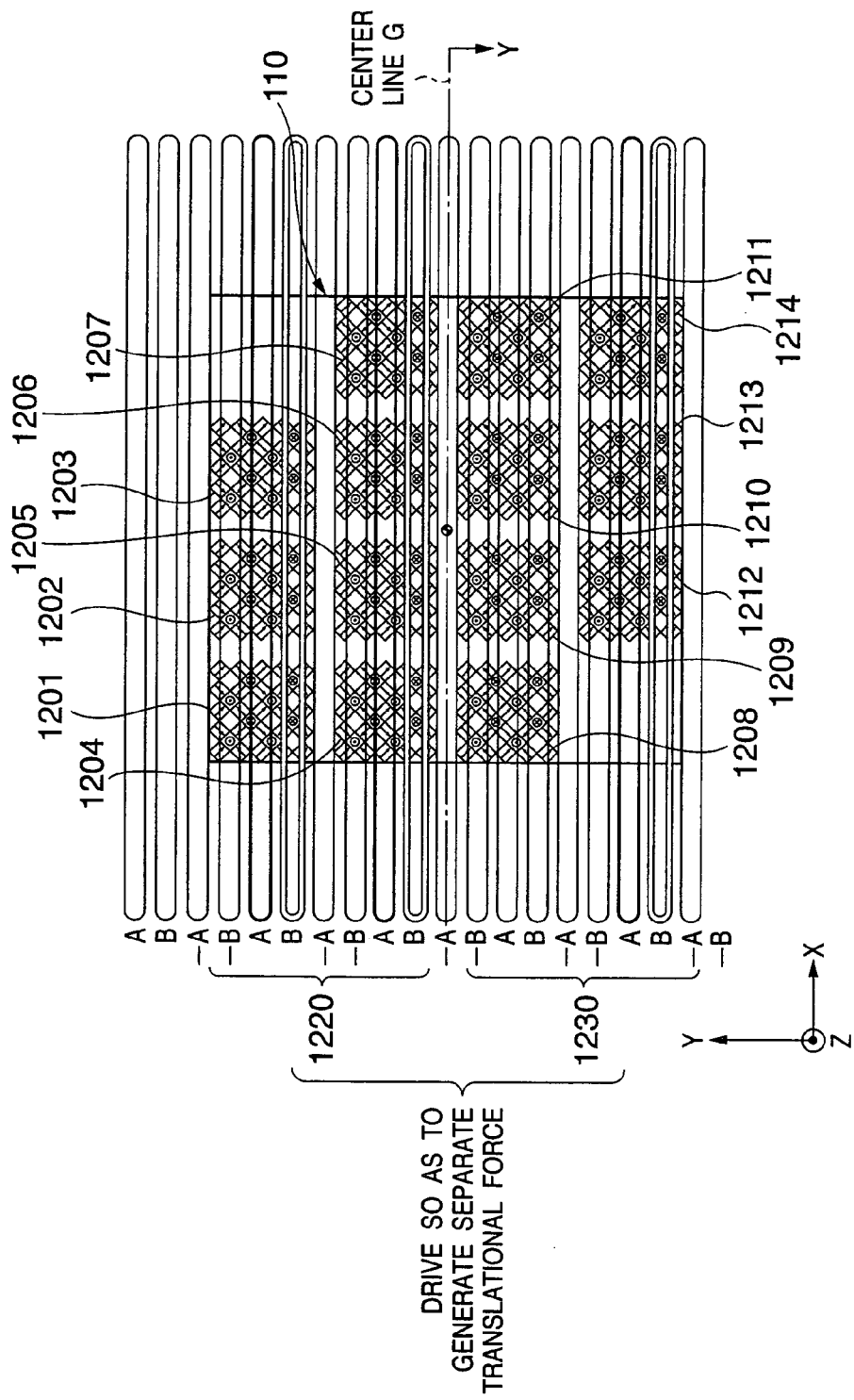

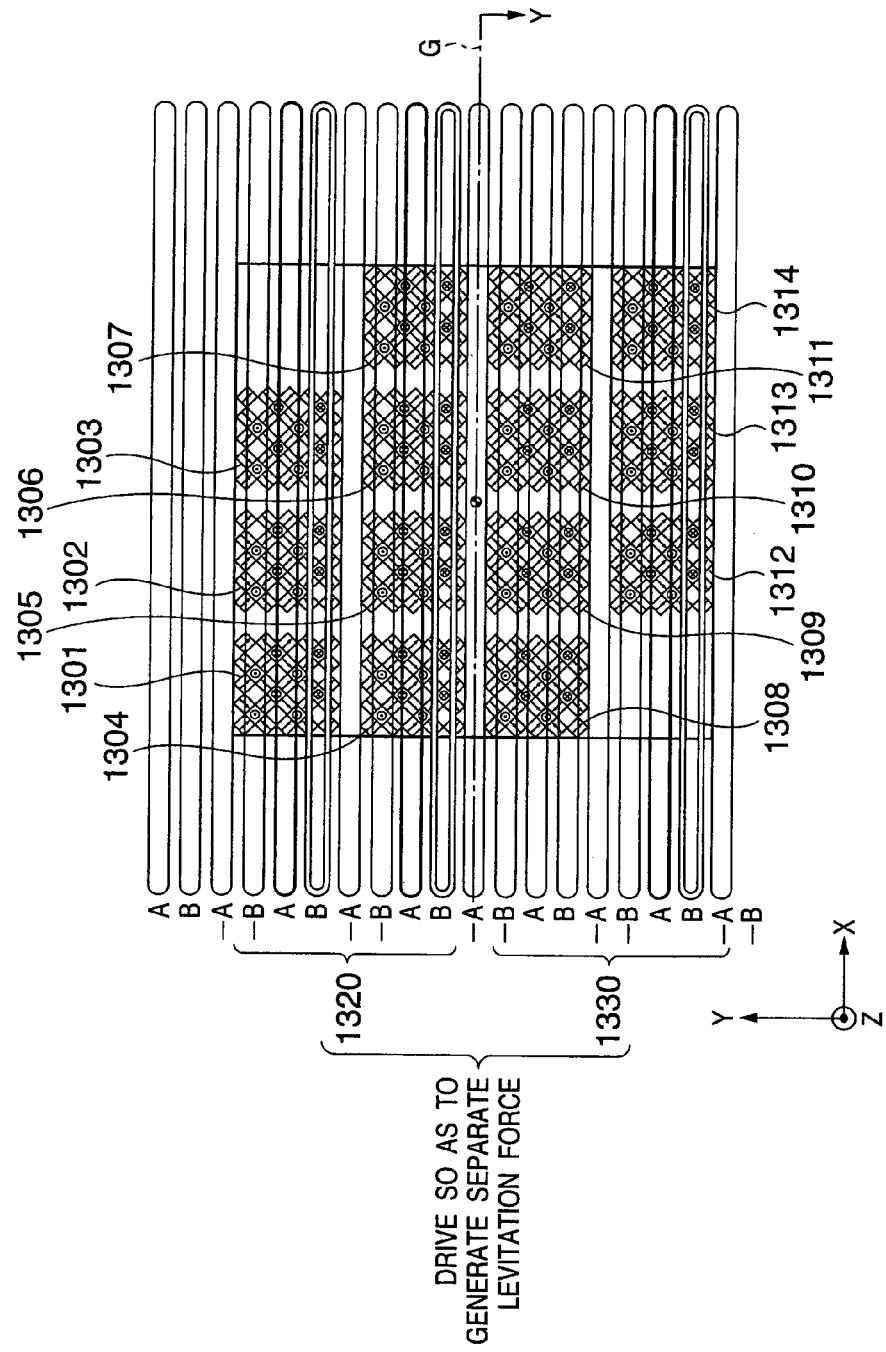

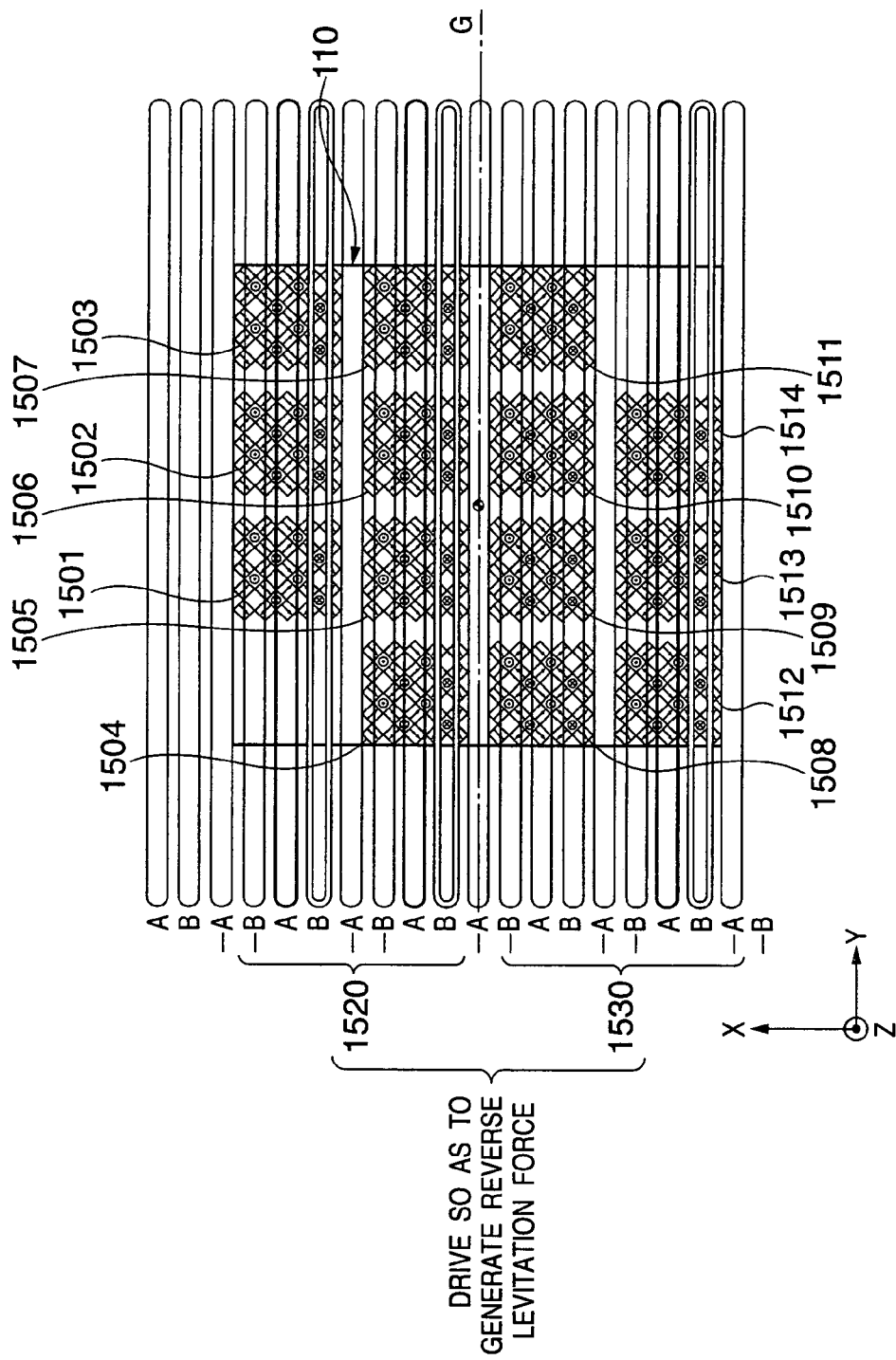

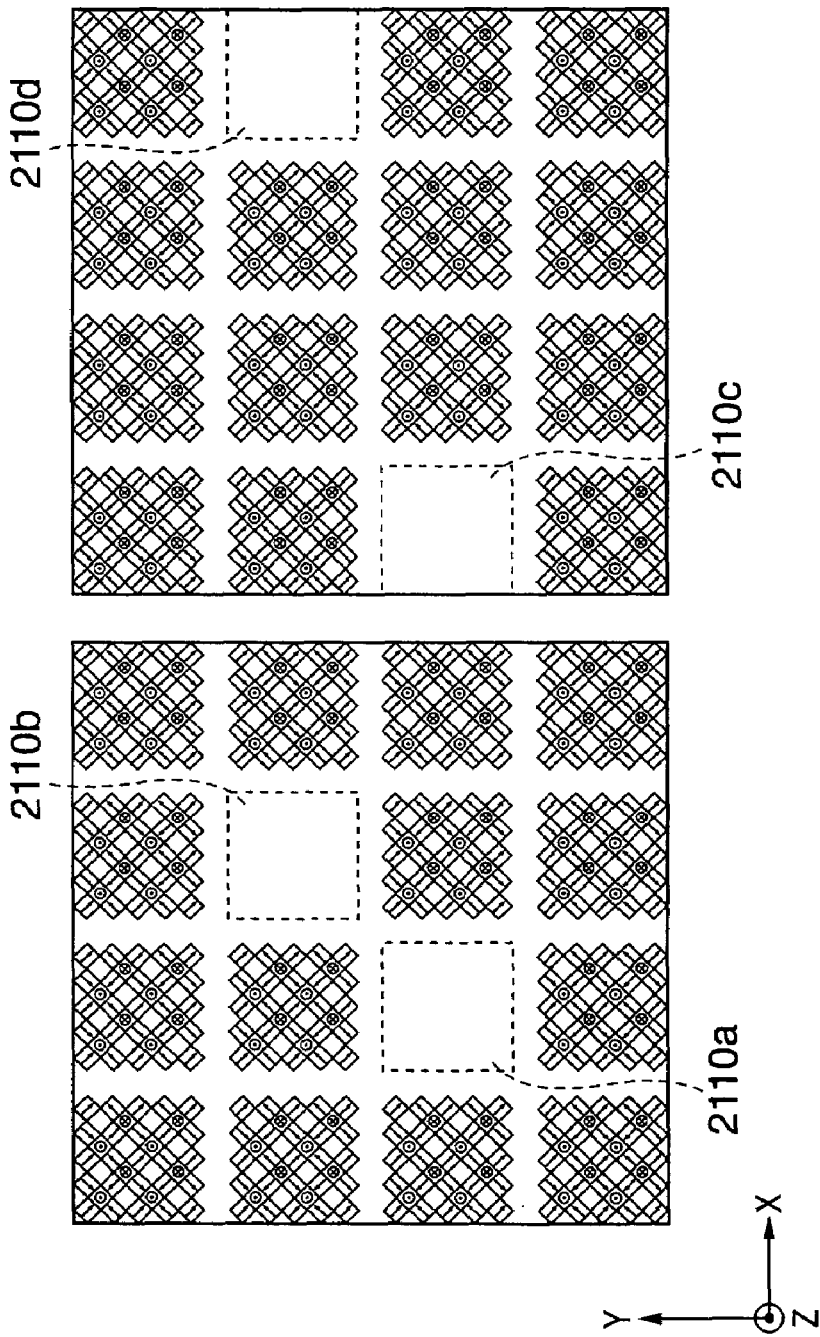

SECOND DIRECTION

FIRST DIRECTION

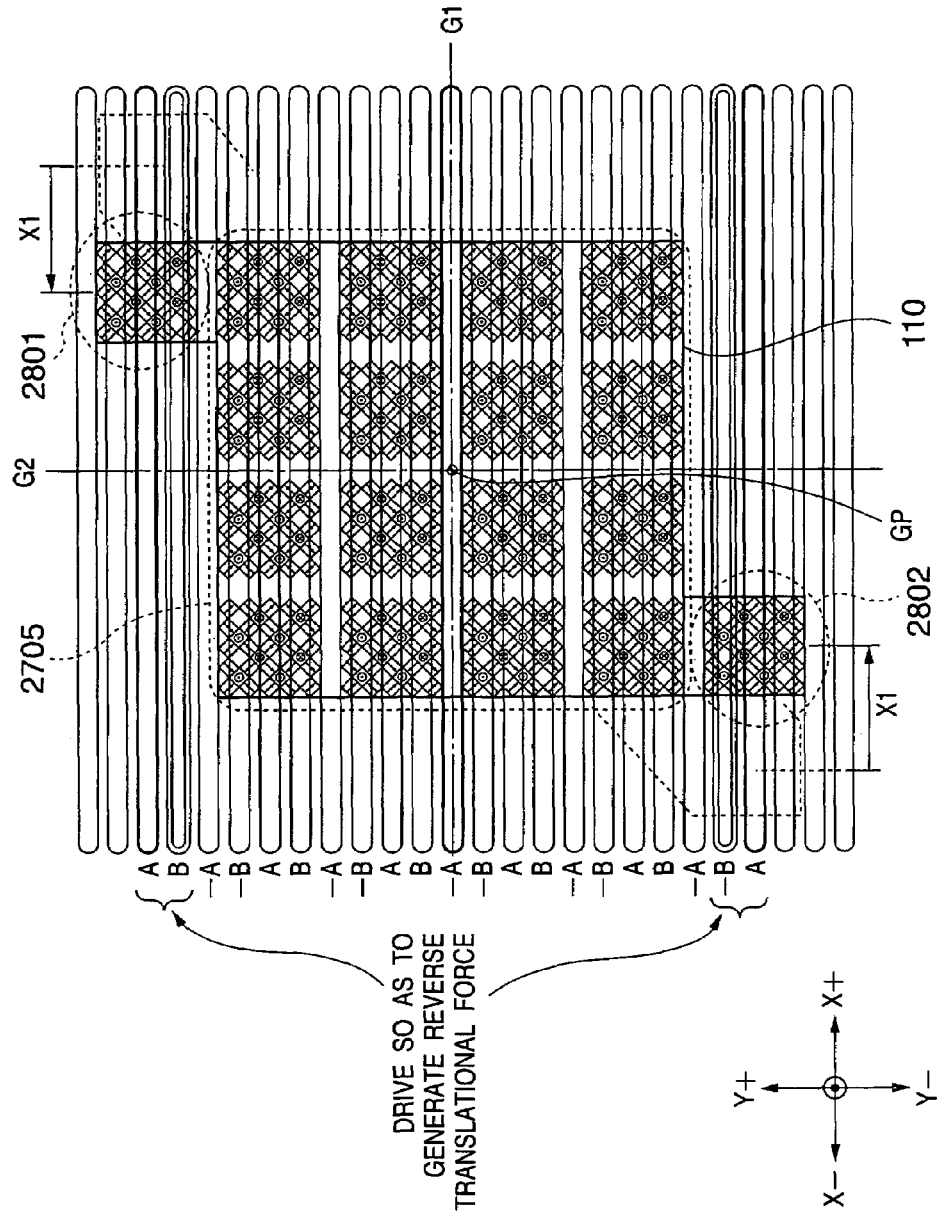

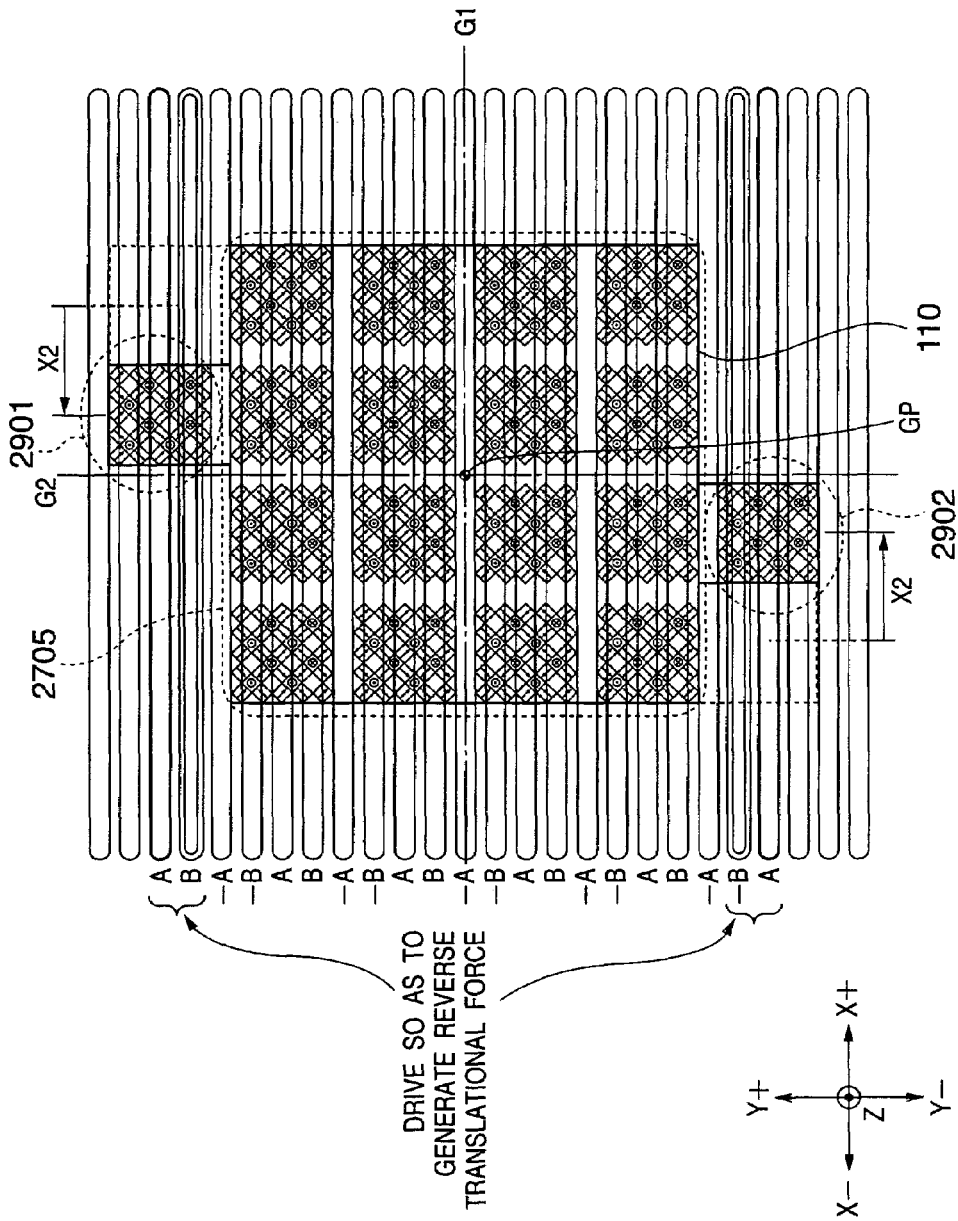

ALIGNMENT APPARATUS AND EXPOSURE APPARATUS USING THE SAME

This application is a divisional application of copending U.S. patent application No. 10/735,650, filed Dec. 16, 2003.

FIELD OF THE INVENTION

The present invention relates to an alignment apparatus capable of high-accuracy alignment and an exposure apparatus using the same.

BACKGROUND OF THE INVENTION

A conventional example of a stage mechanism which has a plate-like member as a movable portion to align the movable portion at a predetermined position in an in-place direction is disclosed in a patent publication (Japanese Patent Laid-Open No. 8-006642). In the disclosed arrangement, only a plate-like member which holds a workpiece is two-dimensionally moved using a plane pulse motor as a driving source. This method moves only the plate-like member as the movable portion and thus is suitable for reducing the size and weight of a stage movable portion.

FIG. 24 is a view showing the arrangement of a movable element in a conventional stage mechanism. An air supply hole 60 and units 52, 54, 56 and 58 each having coil-wounded inductor toothed cores are formed in a box-like member 22 to constitute a movable element.

FIG. 25 is a view showing the arrangement of part of a stator in the conventional stage mechanism. The stator is formed as a plate-like member 24, and magnetic projections 72 are two-dimensionally formed on a magnetic base 70. A space between the projections 72 is filled with a resin 74.

FIG. 26 is a sectional view of the stator and movable element in the conventional example. The movable element further comprises permanent magnets 80 and 82, each of which serves as the thrust source of the movable element and at the same time generates a suction force between the movable element and the stator. Air supplied from the air supply hole 60 of the movable element generates an air pressure between the movable element and the stator. The air pressure and suction force become well balanced, thereby allowing the movable element to levitate above apart from the stator.

The units 54 and 56 each having coil-wounded inductor toothed cores generate a thrust in the first direction while the units 52 and 58 generate a thrust in the second direction perpendicular to the first direction due to Sawyer's principle. This enables the movable element to freely generate a thrust in the first or the second direction and move two-dimensionally.

However, in the conventional arrangement, the movable element levitates by the air pressure and cannot be used in a vacuum. Also, the stage mechanism is driven by a pulse motor scheme based on Sawyer's principle, and vibrations are likely to be transmitted from the stator both in magnetic gap and traveling directions. This makes it impossible to perform high-accuracy position control.

The movable element includes coils and trailing power cables for supplying power. For this reason, the movable element is susceptible to disturbance by the cables. This also makes it impossible to perform high-accuracy position control.

In addition, the arrangements shown in FIGS. 24 to 26 can generate a thrust only in the first and second directions perpendicular to each other of the in-place direction and cannot perform tilt correction and position control in a rotational direction to control the posture of the stage mechanism. For this reason, they cannot be used in an apparatus which requires a precise posture and high alignment accuracy, such as a semiconductor exposure apparatus. If they are used, a fine adjustment stage needs to be separately provided to control the posture in the rotational direction. This increases the complexity of the stage mechanism.

SUMMARY OF THE INVENTION

The present invention has been proposed to solve the conventional problems, and has as its object to provide an alignment apparatus which solves the problems, and the like.

According to the present invention, the foregoing object is attained by providing an alignment apparatus which generates a driving force between a plate-like movable element and a stator facing the movable element to control alignment of the movable element, comprising: movable element magnets which are arrayed in a plate-like plane of the movable element in accordance with an array cycle and are magnetized in predetermined directions; stator coils which are arrayed at intervals corresponding to the array cycle; and a current controller which supplies control currents having phase differences to each pair of adjacent ones of the stator coils to generate a driving force for driving the movable element between the movable element magnets and the stator coils facing the movable element magnets.

Other features and advantages of the present invention will be apparent from the following descriptions taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 5A is a view for explaining the generation principle of a translational force and a levitation force;

FIG. 5B is a control block diagram for controlling to drive the movable element 110 according to the embodiment;

FIG. 10 is a view for explaining control for generating moments about the Y-axis to control rotation;

FIG. 12 is a view for explaining control of translational driving in the Y-axis direction and rotational driving about the Z-axis in the modification;

FIG. 13 is a view for explaining control of translational (levitation) driving in the Z-axis direction and rotational driving about the X-axis in the modification;

FIG. 15 is a view for explaining control of translational (levitation) driving in the Z-axis direction and rotational driving about the Y-axis in the modification;

FIGS. 21A and 21B are views showing modifications of the arrangement of movable element magnets;

FIG. 28 is a view showing still another modification of the arrangement of movable element magnets; and FIG. 29 is a view showing still another modification of the arrangement of movable element magnets.

DETAILED DESCRIPTION OF THE PREFERRED EMBODIMENT

A preferred embodiment of the present invention will now be described in detail in accordance with the accompanying drawings.

Embodiment

Figure 1A:
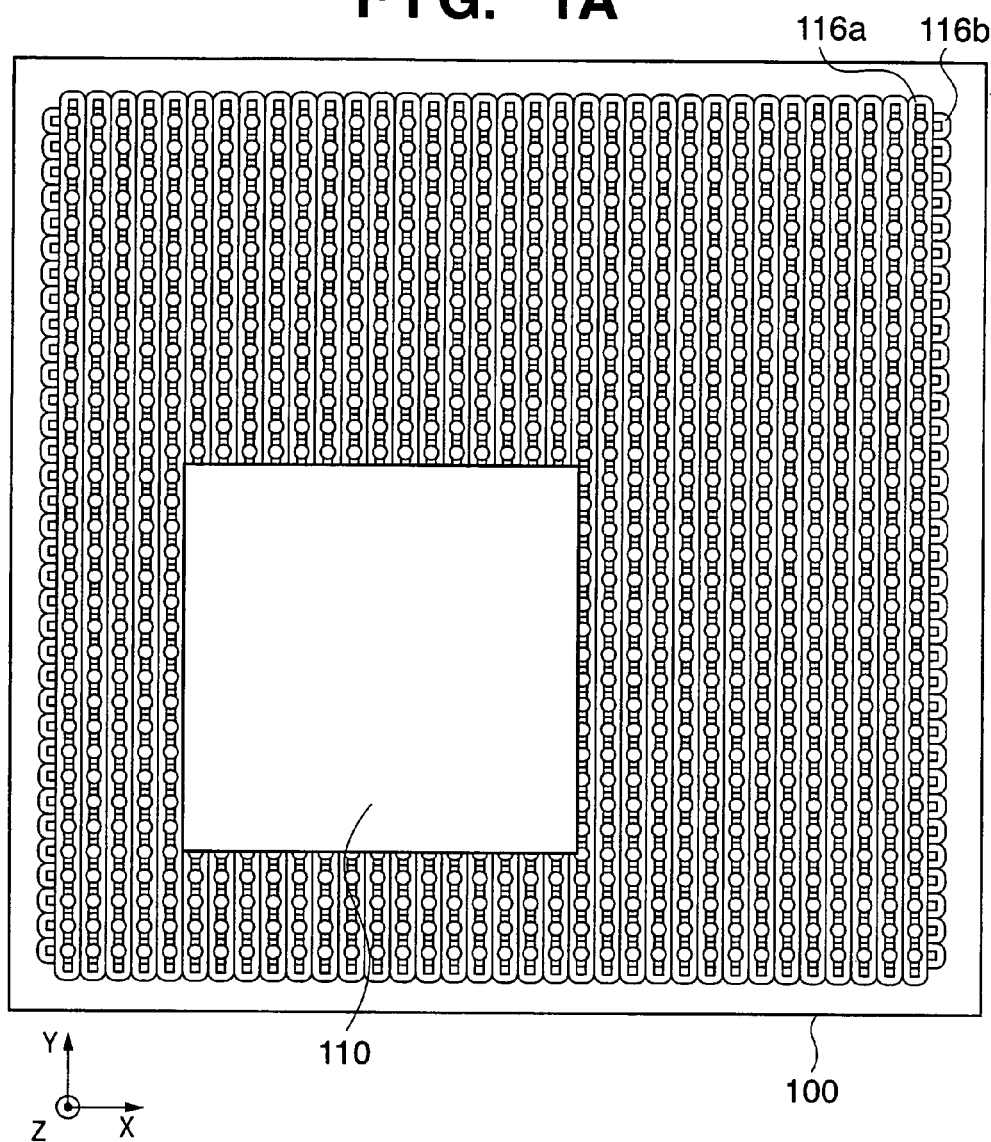
FIGS. 1A and 1B are views for explaining an alignment apparatus according to an embodiment of the present invention.
Figure 1B:
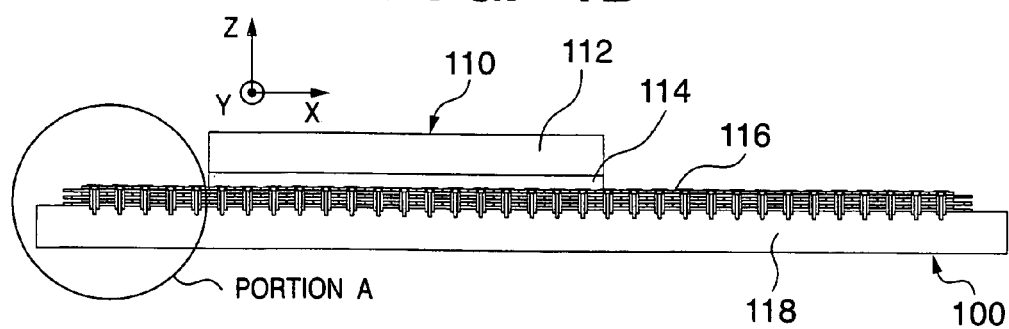

An embodiment according to the present invention will be described with reference to FIGS. 1A and 1B. FIG. 1A is a view showing a state wherein a movable element 110 is aligned in the X-Y plane of a stator 100. The movable element 110 is implemented as a plate-like member. FIG. 1B is a view showing the relationship between the stator and the movable element as seen in the direction of the X-Z plane. The movable element 110 comprises a top plate 112 almost in the shape of a rectangular parallelepiped and a plurality of permanent magnet arrays 114 arranged below the top plate.

The top plate 112 is desirably made of a substance having high specific rigidity such as ceramic.

Figure 2:
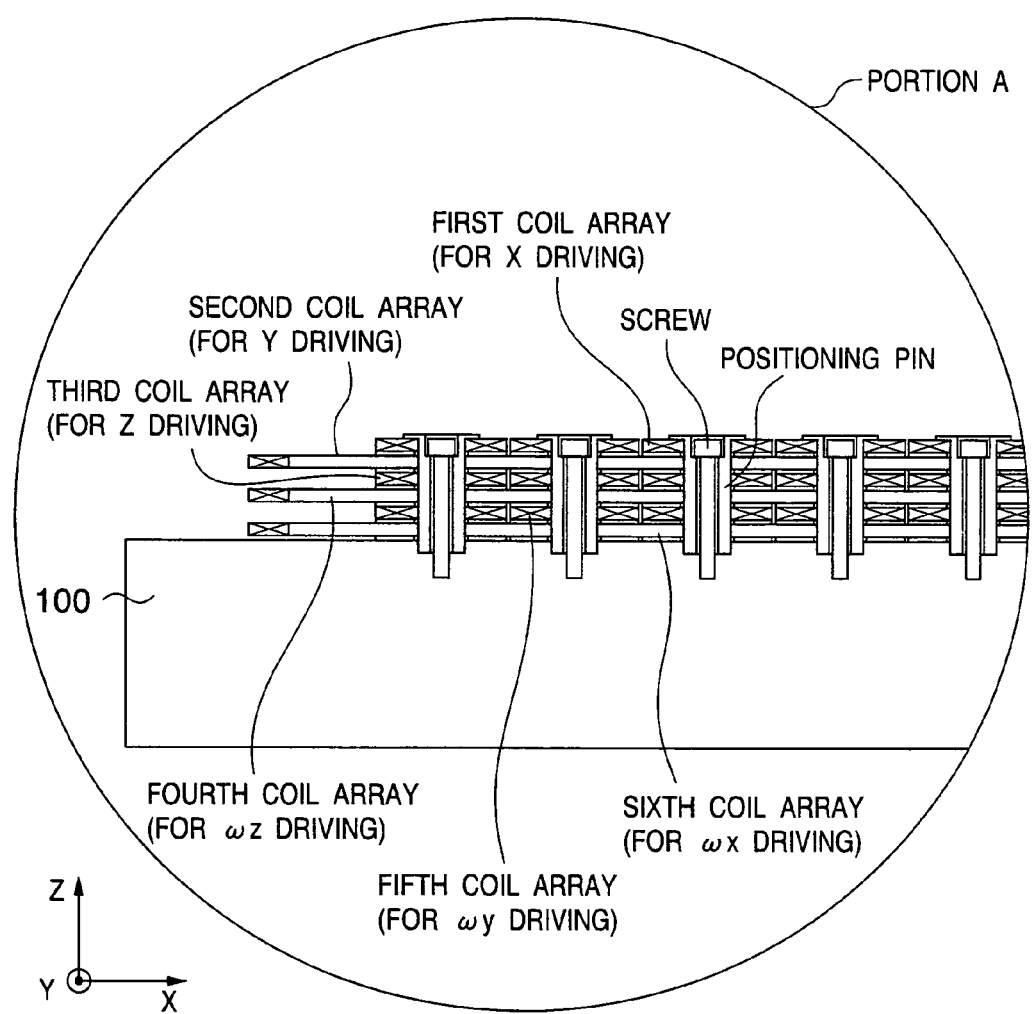
FIG. 2 is an enlarged view of the arrangement of fixed coils according to the embodiment.
Figure 3A:
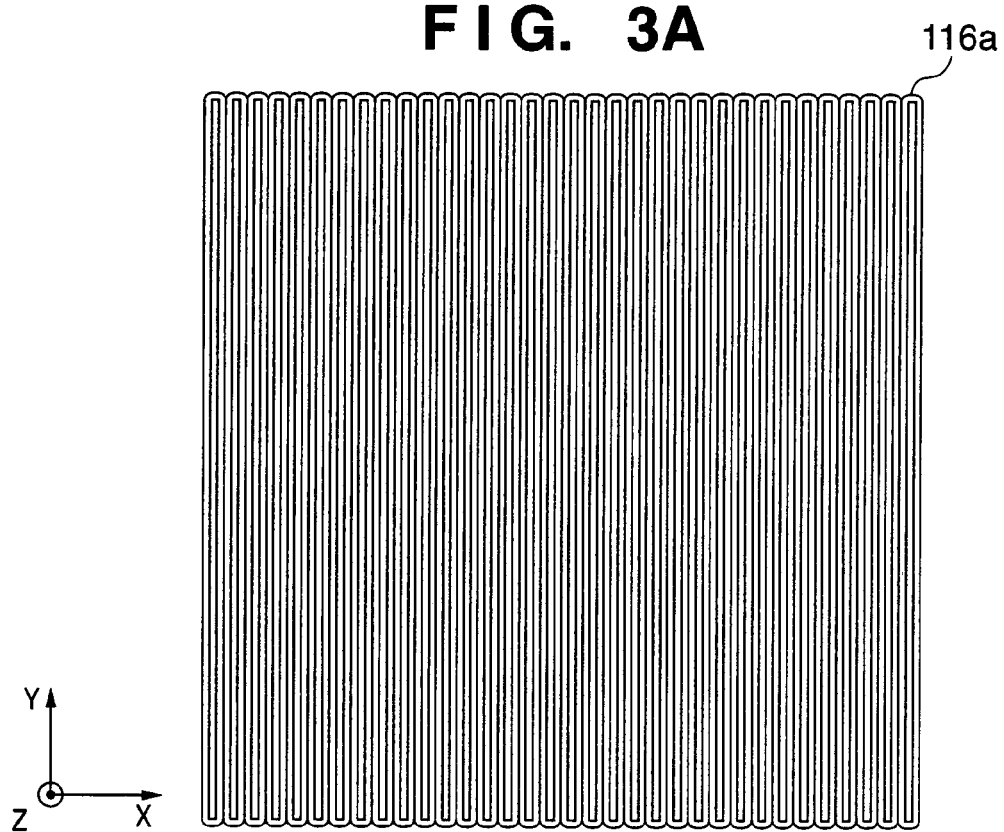
FIGS. 3A and 3B are views for explaining the arrangement of the fixed coils according to the embodiment.
Figure 3B:
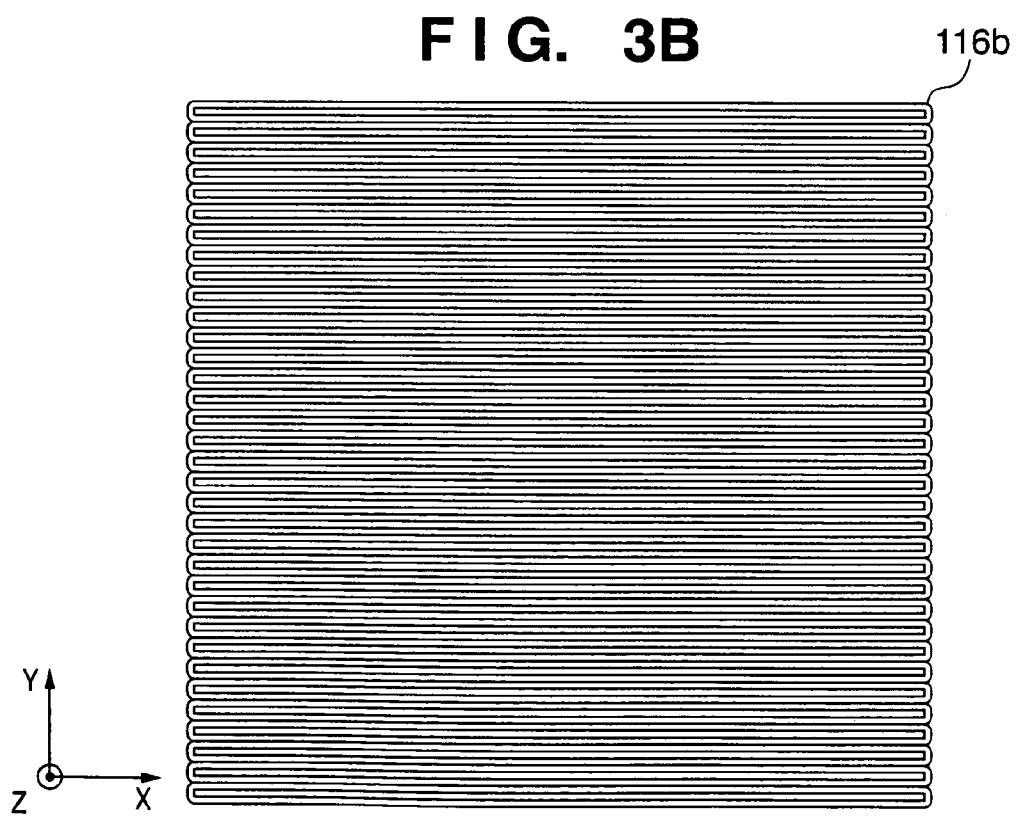

The stator 100 comprises a base 118 and six layers of coils 116 fixed on the base. Each layer constituting the six layers of coils 116 comprises a plurality of almost oblong coils (116a and 116b), as shown in FIG. 3A or 3B. Each almost oblong coil is arranged such that its linear portion is almost parallel to the X or Y direction. The arrangement of FIG. 1B has three layers each comprising almost oblong coils whose linear portions are parallel to the X direction and three layers each comprising almost oblong coils whose linear portions are parallel to the Y direction. That is, the arrangement has an equal number of layers both in the X and Y directions. FIG. 2 is an enlarged view of the stacked state of coils with a focus on a portion A in FIG. 1B.

<Explanation of Stator Coil>

The sixth coil array is arranged on the base member 108 through an insulating sheet (not shown). The sixth coil array is a coil layer comprising almost oblong coils whose linear portions are parallel to the X direction and is used for driving in the ωx direction.

The fifth coil array is arranged on the sixth coil array through an insulating sheet (not shown). The fifth coil array is a coil layer comprising almost oblong coils whose linear portions are parallel to the Y direction and is used for driving in the ωy direction.

The fourth coil array is arranged on the fifth coil array through an insulating sheet (not shown). The fourth coil array is a coil layer comprising almost oblong coils whose linear portions are parallel to the X direction and is used for driving in the ω z direction.

The third coil array is arranged on the fourth coil array through an insulating sheet. The third coil array is a coil layer comprising almost oblong coils whose linear portions are parallel to the Y direction and is used for driving in the Z direction.

The second coil array is arranged on the third coil array through an insulating sheet. The second coil array is a coil layer comprising almost oblong coils whose linear portions are parallel to the X direction and is used for driving in the Y direction.

The first coil array is arranged on the second coil array through an insulating sheet. The first coil array is a coil layer comprising almost oblong coils whose linear portions are parallel to the Y direction and is used for driving in the X direction.

<Explanation of Movable Element>

Figure 4A:
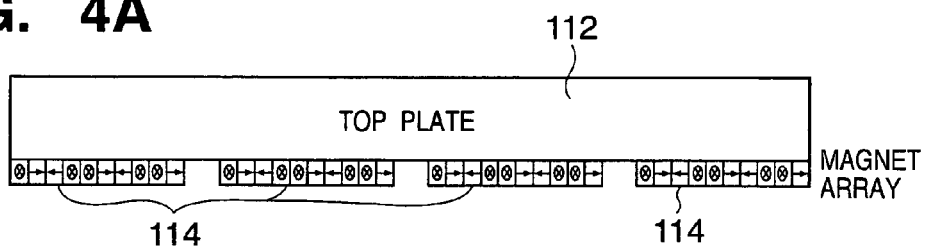
FIGS. 4A and 4B are views showing the arrangement of permanent magnet arrays 114 on a movable element 110.
Figure 4B:
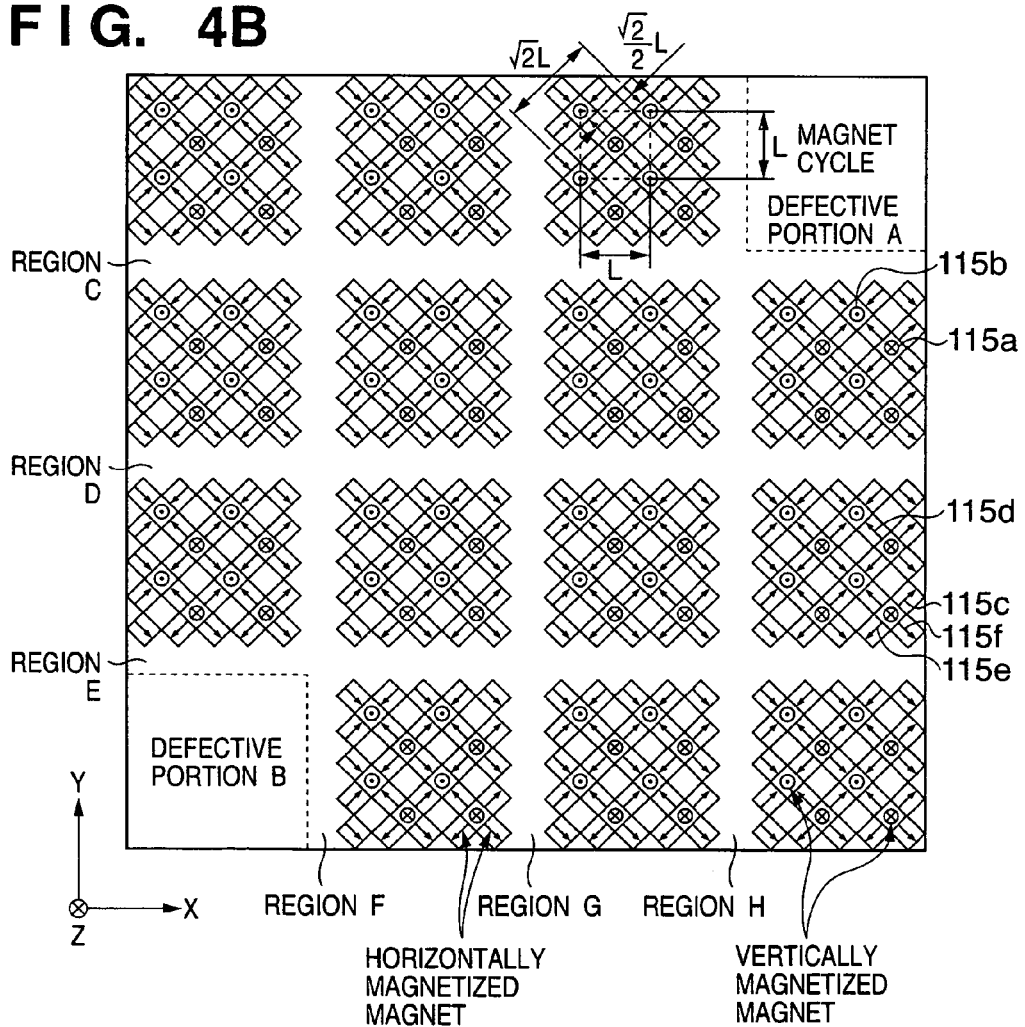

FIGS. 4A and 4B are views showing the arrangement of the permanent magnet arrays 114 on the movable element 110. The plurality of permanent magnet arrays 114 are arranged below the top plate 112 (FIG. 4A). Each permanent magnet array 114 comprises six types of magnets: one magnetized upward in the Z direction; one magnetized downward in the Z direction; one magnetized at an angle of 45° with respect to the X direction; one magnetized at an angle of 135° with respect to the X direction; one magnetized at an angle of −135° with respect to the X direction; and one magnetized at an angle of −45° with respect to the X direction.

Each magnet magnetized upward in the Z direction is marked with a symbol formed by inserting "X" into "○" (e.g., 115a in FIG. 4B); and each magnet magnetized downward in the Z direction, a symbol formed by inserting "•" into "○" (115b in FIG. 4B).

Each magnet magnetized at an angle of 45° (115c in FIG. 4B), an angle of 135° (115d in FIG. 4B), an angle of −135°

(115*e* in FIG. 4B), or an angle of −45° (115*f* in FIG. 4B) with respect to the X direction is marked with an arrow pointing in a corresponding direction.

In FIG. 4B, a magnetic flux facing downward in the Z direction is generated near each magnet magnetized upward in the Z direction while a magnetic flux facing upward in the Z direction is generated near each magnet magnetized downward in the Z direction. A magnetic flux at an angle of −135° with respect to the X direction is generated near each magnet magnetized at an angle of 45° with respect to the X direction while a magnetic flux at an angle of −45° with respect to the X direction is generated near each magnet magnetized at an angle of 135° with respect to the X direction. Similarly, a magnetic flux at an angle of 135° with respect to the X direction is generated near each magnet magnetized at an angle of −45° with respect to the X direction while a magnetic flux at an angle of 45° with respect to the X direction is generated near each magnet magnetized at an angle of −135° with respect to the X direction. This is because a magnet in an array of magnets having magnetization directions and arrayed in a horizontal plane generates outside the magnet a magnetic flux in a direction opposite to the magnetization direction of the magnet.

The magnets magnetized in the Z direction are arranged both in the X and Y directions at intervals of L and are arranged in their diagonal directions at intervals of $(\sqrt{2})\times L$. In the diagonal directions, the magnets magnetized upward in the Z direction and those magnetized downward in the Z direction are alternately arranged at intervals of $(\sqrt{2}/2)\times L$.

The magnets 115*c* magnetized at an angle of 45° with respect to the X direction and the magnets 115*e* magnetized at an angle of −135° with respect to the X direction are alternately arranged between the magnets 115*a* magnetized upward in the Z direction and the magnets 115*b* magnetized downward in the Z direction.

The magnets 115*f* magnetized at an angle of −45° with respect to the X direction and the magnets 115*d* magnetized at an angle of 135° with respect to the X direction are alternately arranged between the magnets 115*a* magnetized upward in the Z direction and the magnets 115*b* magnetized downward in the Z direction. This arrangement is known as a so-called Halbach array.

FIG. 4B is a view of the movable element 110 as seen from below. Each magnetic flux facing downward in the Z direction (a magnetic flux directed upward from the drawing surface of FIG. 4B) is strengthened by magnetic fluxes gathering from four directions (±45° or ±135° with respect to the X-axis direction) while each magnetic flux facing upward in the Z direction (a magnetic flux directed downward from the drawing surface) is strengthened by magnetic fluxes dispersing in the four directions. On the other side, i.e., at the joint between the magnets and the top plate 112, magnetic fluxes cancel each other, and the magnetic flux distribution becomes almost zero.

On the side in which the stator 100 and movable element 110 face each other, the magnets magnetized in the ±Z directions as well as the magnets magnetized at angles of ±45° or ±135° with respect to the X direction are arranged both in the X and Y directions at intervals of L. For this reason, the magnetic flux densities of the vertical (Z-direction) and horizontal (±45° or ±135° with respect to the X direction) directions generated in the X or Y direction have almost sine wave distributions as the function of the cycle of L.

The vertical magnetic flux density and the horizontal magnetic flux density are out of phase with each other by L/4. Assuming that the cycle of L is 360°, the peak position of the vertical magnetic flux density distribution and the horizontal magnetic flux density distribution are out of phase with each other by 90°(=360°/4).

Referring to FIG. 4B, there are defective portions A and B in the upper right and lower left corners on a diagonal line, respectively. The defective portions A and B contribute to generation of moments in the ωz direction (to be described later). As shown in FIG. 4B, there are also three defective regions (regions C, D, and E) in the X direction and three defective regions (regions F, G, and H) in the Y direction, in addition to the defective portions on the diagonal line. These regions are so controlled as to prevent, without fail, coils facing them from being energized (to be described later). They do not greatly contribute to a thrust, and thus no magnets are attached to them for the purpose of reducing the weight. Consequently, 14 magnetic units (to be referred to as "small magnet units" hereinafter) are arranged on the lower surface of the top plate 112. Each magnetic unit comprises 33 magnets in total: four magnets magnetized in the +Z direction; four magnets magnetized in the −Z direction; nine magnets magnetized at an angle of −45° with respect to the X direction; six magnets magnetized at an angle of 45° with respect to the X direction; six magnets magnetized at an angle of 135° with respect to the X direction; and four magnets magnetized at an angle of −135° with respect to the X direction.

<Generation Principle of Translational Force and Levitation Force>

The generation principle of a translational force and levitation force will be described with reference to 51*a* and 51*b* in FIG. 5A. The basic principle is based on a Lorentz force using the Fleming's rule. Each coil is arranged such that its linear portion is parallel to the X or Y direction. For this reason, when a current is supplied to coils in the vertical (Z-direction) magnetic flux density, a translational force is generated in the X or Y direction while a current is supplied to the coils in the horizontal magnetic flux density, a levitation force or a force in a direction opposite to the levitation force is generated. Reference numeral 51*a* in FIG. 5A denotes a view of the second coil array (see FIG. 2) and the surface of the top plate 112 on which the magnetic arrays are arranged as seen from below in the Z-axis direction. As described above, the second coil array is a coil array layer comprising almost oblong coils whose linear portions are parallel to the X direction. The span of the linear portion of each almost oblong coil is half the magnet cycle of L (FIG. 4B), i.e., L/2. Each two adjacent almost oblong coils are spaced apart from each other by (¾)×L. Assuming that the cycle of L is 360°, the adjacent almost oblong coils are out of phase with each other by (¾) of the cycle of L, i.e., 270°.

Reference numeral 51*b* in FIG. 5A is a view showing the relationship between the layout of the almost oblong coils and their phases. Assume that a certain coil (e.g., a coil 150*a* in the view 51*a* of FIG. 5A) is located on the X-axis (=phase of 0°) and is used as a reference. The phase of an adjacent coil 150*b* shifts by 270° and reaches a point A2 in the view 51*b* of FIG. 5A. The phase of a coil 150*c* shifts from that of the coil 150*b* by 270° and reaches a point B2 in the view 51*b* of FIG. 5A. For the coil 150*a*, the phase is shifted 180°with respect to 0° in the X-axis. The phase of a coil 150*d* adjacent to the coil 150*c* shifts from that of the coil 150*c* by 270° and reaches a point C2 in the view 51*b* of FIG. 5A. The coil 150*d* has a phase of 90° with reference to the coil 150*a*.

A coil 150e adjacent to the coil 150d has a phase of 270° with reference to the coil 150d, and the phase reaches a point D2. In this case, the coil 150a and coil 150e are in phase with each other.

If coils are alternately wound in opposing directions or control is performed such that supplied currents flow through the coils alternately in opposing directions, the coils can act as if each coil has either of two phases of 0° and 90°. In the view 51a of FIG. 5A, currents are controlled to flow alternately in opposing directions, and coils to which reverse currents are supplied are marked with a symbol (minus). Apparently, a current to be supplied to each coil has either of two phases, A-phase and B-phase. When currents for A-phase and B-phase are determined, those for −A-phase and −B-phase are automatically determined. As described above, the vertical magnetic flux density and the horizontal magnetic flux density each has an almost sine wave distribution with the cycle of L. If sine wave control is so performed as to supply to each coil a current in phase with the vertical magnetic flux density distribution, a translational force proportional to the amplitude of sine waves of the current is generated regardless of position.

More specifically, let Y be a position in the view 51a of FIG. 5A, and the position Y is set at 0. If the position Y changes in the direction of an arrow, currents having respective phases can be given by:

A-phase current: $IA = Ic \times \cos((Y/L) \times 2 \times \pi)$ (1)

B-phase current: $IB = Ic \times \sin((Y/L) > 2 \times \pi)$ (2)

−A-phase current: current reverse to A-phase current (3)

−B-phase current: current reverse to B-phase current (4)

Currents according to expressions (1) to (4) are supplied, a translational force of a magnitude proportional to a current Ic can be generated in the ±Y directions regardless of position.

When control is so performed as to supply to each coil a current in phase with the horizontal magnetic flux density distribution, a substantially constant levitation force or a force in a direction opposite to the levitation force can be generated regardless of position. More specifically, the position Y in the view 51a of FIG. 5A is set at 0. If the position Y changes in the direction of an arrow, currents having respective phases can be given by:

A-phase current: $IA = Ic \times \cos((Y/L) \times 2 \times \pi + (\pi/2)) = Ic \times \sin((Y/L) \times 2 \times \pi)$ (5)

B-phase current: $IB = Ic \times \sin((Y/L) \times 2 \times \pi + (\pi/2)) = Ic \times \cos((Y/L) \times 2 \times \pi)$ (6)

−A-phase current: current reverse to A-phase current (7)

−B-phase current: current reverse to B-phase current (8)

Currents according to expressions (5) to (8) are supplied, a force (a levitation force or a force in a direction opposite to the levitation force) of a magnitude proportional to the current Ic can be generated in the ±Z directions regardless of position.

Note that the current Ic has an arbitrary value in expressions (1), (2), (5), and (6).

Each coil layer comprising almost oblong coils whose linear portions are parallel to the X direction, as shown in the view 51a of FIG. 5A, can generate a force of an arbitrary magnitude in the ±Y or ±Z directions.

Likewise, each coil layer (e.g., FIG. 3A) comprising almost oblong coils whose linear portions are parallel to the Y direction can generate a thrust, a levitation force, or a force in a direction opposite to the levitation force having a magnitude proportional to the current Ic in the ±X or ±Z directions.

As described with reference to FIG. 4B, the lower surface of the top plate 112 is not entirely covered with magnets and has linear defective regions. Even if a current is supplied to each portion without any magnet, neither a thrust nor a levitation force is generated. Current application is so controlled as to prevent a current from being supplied to a portion corresponding to each defective region. In other words, control is performed such that only coils facing magnets are energized.

FIG. 5B is a control block diagram for controlling to drive the movable element 110. A current controller 500 applies the currents defined by expressions (1) to (8) at predetermined timings to an A-phase coil (502), a −A-phase coil (504), a B-phase coil (506), and a −B-phase coil (508). The value of each current generated by the current controller 500 is controlled on the basis of a control command value 501 output from an apparatus controller 510 which controls the entire apparatus, position detection information 503 (503a to 503c) of the movable element 110 detected by position detectors 520 (520a to 520c), and posture information 505 (505a to 505c) of the movable element 110 detected by posture detectors 530 (530a to 530c).

In current control, control for supplying a current to only coils facing magnets is based on an arrangement in which the number of A-phase (or −A-phase) coils is equal to that of B-phase (or −B-phase) coils. As described above, if control is so performed as to supply a current in phase with the magnetic flux density of coils, an almost predetermined translational force or levitation force can be generated regardless of position. This requires that the number of coils corresponding to A-phase is equal to that of coils corresponding to B-phase. That is, equalization of the numbers of coils having different phases makes it possible to efficiently utilize a force generated on the side of A-phase and one generated on the side of B-phase as a translational force, a levitation force, and the like.

At this time, on/off control for equalizing the number of A-phase coils with that of B-phase coils will be described with reference to FIGS. 6A, 6B, 7A, and 7B.

<ON/OFF Control>

Figure 6A:
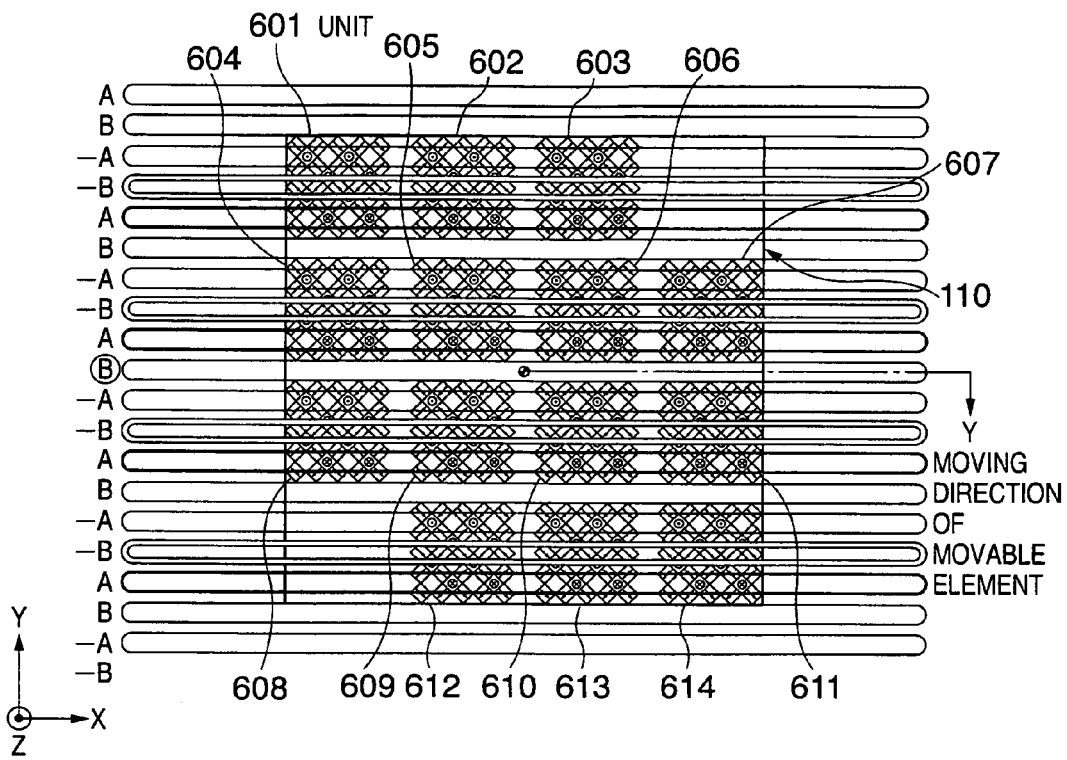
FIGS. 6A and 6B are views for explaining switching of energization for a coil array to generate a translational force.
Figure 6B:
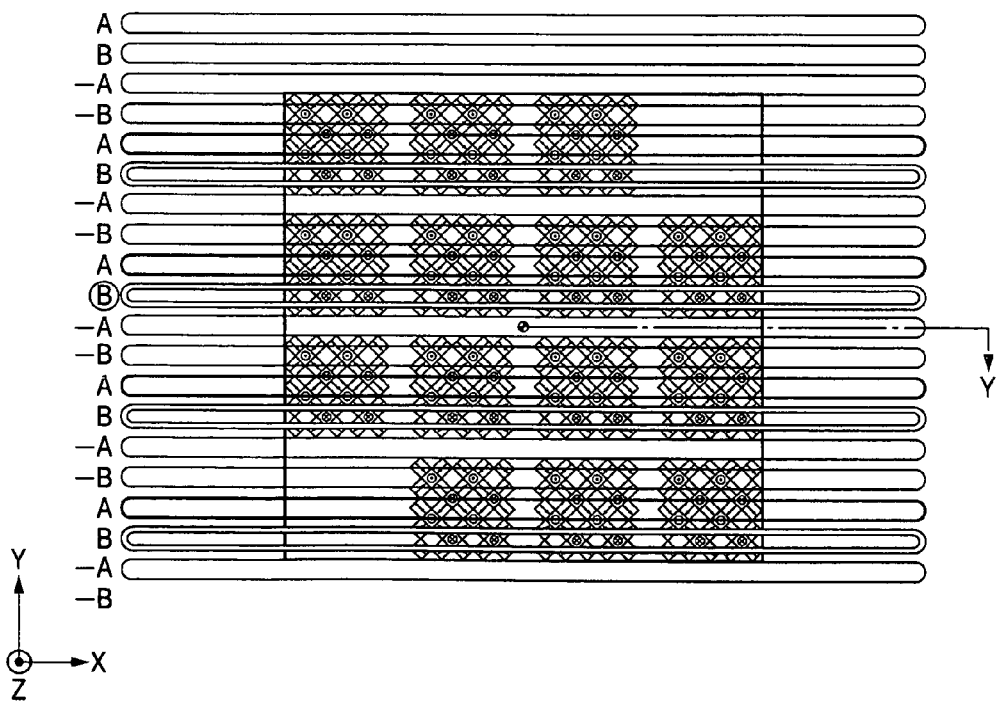

FIGS. 6A and 6B are views for explaining switching of energization for a coil array to generate a translational force. The relationship between the permanent magnet arrays 114 arranged on the surface, of the movable element 110 (the lower surface of the top plate 112), facing the stator 100 and coils arranged on the base 118 of the stator 100 is shown within an X-Y plane. As described with reference to FIG. 4A, 14 small magnetic units (601 to 614) are arranged on the lower surface of the top plate 112. Each small magnetic unit comprises 33 magnets in total: four magnets magnetized in the +Z direction; four magnets magnetized in the −Z direction; nine magnets magnetized at an angle of −45° with respect to the X direction; six magnets magnetized at an angle of 45° with respect to the X direction; six magnets magnetized at an angle of 135° with respect to the X direction; and four magnets magnetized at an angle of −135° with respect to the X direction. The on/off control of the coils facing the small magnet units is performed such that only A-phase coils and B-phase coils or −A-phase coils and −B-phase coils equal in number act on each small unit.

The equal number is one for one layer, and the on/off control of coils is performed such that one A-phase (or −A-phase) coil and one B-phase (or −B-phase) coil act on each small unit.

Switching from the ON state to the OFF state or from the OFF state to the ON state is performed for coils to which no current is supplied.

FIG. 6A is a view with a focus on a state in which the movable element 110 moves in a direction (movable element moving direction) of an arrow with respect to the Y-axis. In FIG. 6A, each energized coil, i.e., each coil in the ON state is indicated by a double line (each −B-phase coil is in the ON state) or a wide solid line (each A-phase coil in the ON state) while each coil in the OFF state is indicated by a solid line. At this time, each −A-phase coil is in the OFF state (solid line), and each A-phase coil is in the ON state (wide solid line). If sine wave control is so performed as to supply to each coil a current in phase with the vertical magnetic flux distribution, a translational force of a magnitude proportional to the amplitude of sine waves of the current can be generated regardless of position. Accordingly, when the movable element 110 is located at a position shown in FIG. 6A, current control is performed such that a current having the maximum value is supplied to each B-phase coil, whose linear portion is located immediately above magnets magnetized in the ±Z directions. Control is also performed such that no current is supplied to each A-phase coil, whose linear portion is located between magnets magnetized in the ±Z directions. The current controller 500 performs switching from the ON state to the OFF state or from the OFF state to the ON state for coils to which no current is supplied. That is, in a state immediately before the movable element 110 moves to the position shown in FIG. 6A, each −A-phase coil is in the ON state; and each A-phase coil, the OFF state.

Coils outside the movable element 110 are all in the OFF state regardless of whether ±A-phases or ±B-phases. The current controller 500 performs current control in accordance with expressions (1) to (4). A current to be supplied to each A-phase coil or B-phase coil is defined by one of the sine and cosine functions depending on the position of the movable element.

In this state, when the movable element moves further downward, it shifts to a state shown in FIG. 6B. At this time, no current is supplied to each B-phase coil or −B-phase coil. When the movable element 110 is located at a position shown in FIG. 6B, each −B-phase coil, which has been in the ON state in FIG. 6A, is changed from the ON state to the OFF state while each B-phase coil, which has been in the OFF state, is changed from the OFF state to the ON state. The on/off control is performed by repeating the same procedures. This makes it possible to control one A-phase (or −A-phase) coil and one B-phase (or −B-phase) coil to act on each small unit described with reference to FIGS. 4A and 4B. As a whole, control can be performed such that the A-phase (or −A-phase) coils and B-phase (or −B-phase) coils equal in number act. For this reason, a translational force in the ±Y directions of a magnitude proportional to a predetermined command value can be generated regardless of the position of the movable element 110.

Figure 7A:
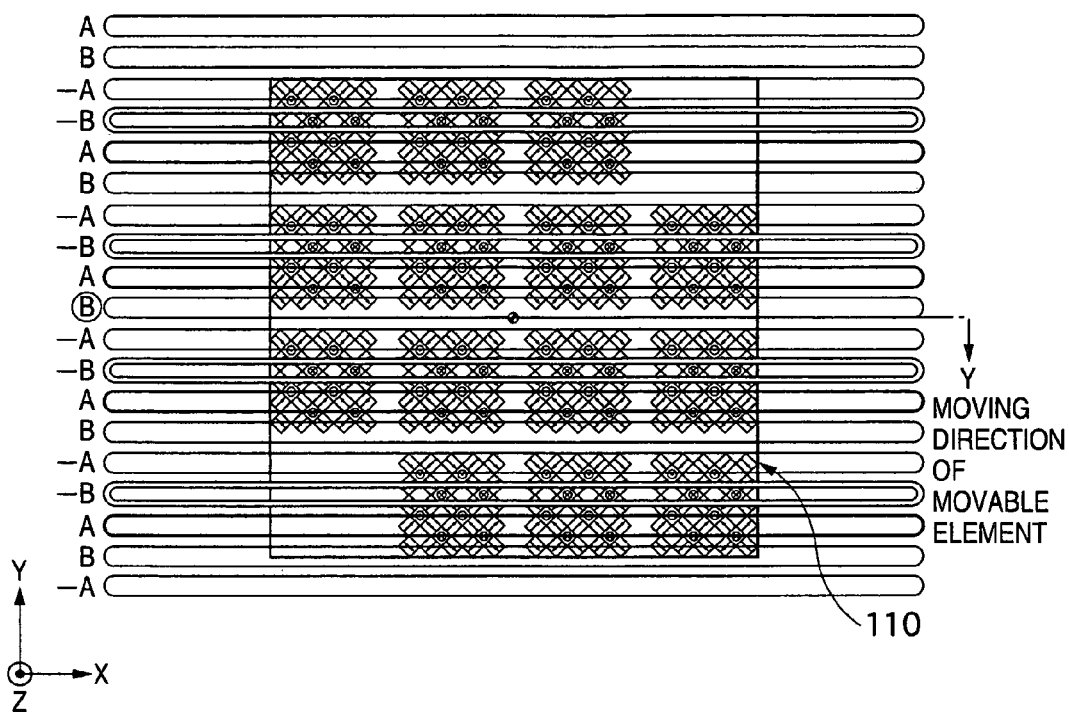
FIGS. 7A and 7B are views for explaining switching of energization for a coil array to generate a levitation force.
Figure 7B:
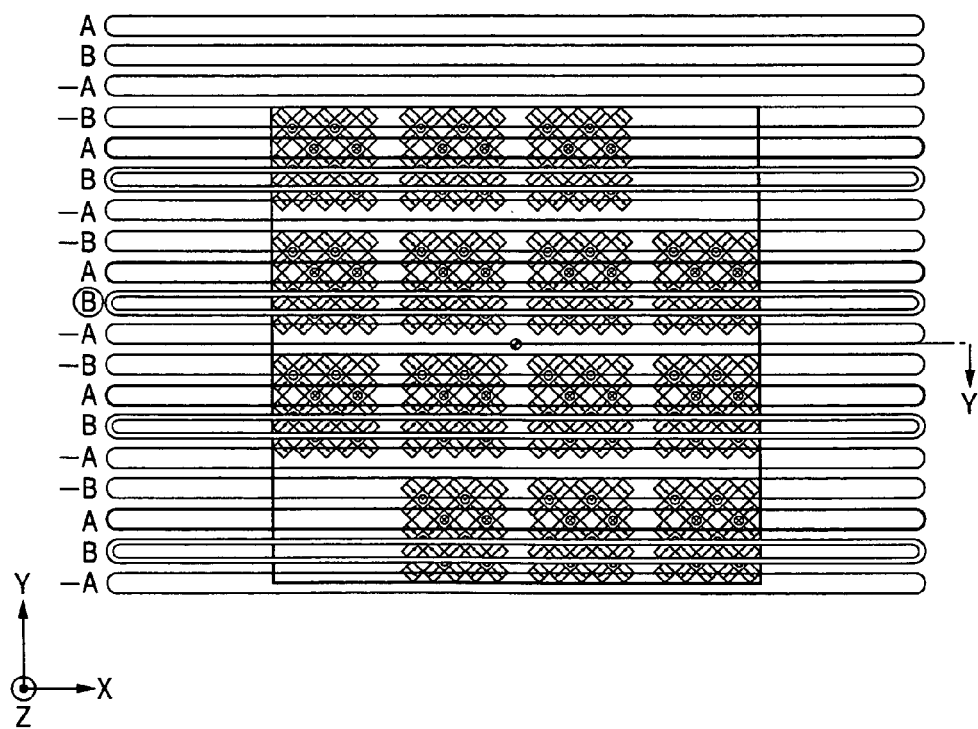

FIGS. 7A and 7B are views for explaining switching of energization for a coil array to generate a levitation force. A switching method to be employed is the same as in FIGS. 6A and 6B. Switching is performed such that one A-phase (or −A-phase) coil and one B-phase (or −B-phase) coil act on each small unit. Control is performed such that the on/off switching occurs at positions to which no current is supplied.

Note that generation of a translational force is different from that of a levitation force in positions to which no current is supplied.

As for a translational force, control is performed such that no current is supplied to each coil whose linear portion is located midway between magnets magnetized in the Z direction and ones magnetized in the −Z direction. As for a levitation force, control is performed such that no current is supplied to each coil whose linear portion is located immediately above magnets magnetized in the ±Z directions. The case of a translational force is shifted from that of a levitation force, by an interval of L/4 in the Y-axis direction, in positions to which no current is supplied in the relationship between the linear portions of coils and magnets magnetized in the ±Z directions.

Assume that the movable element moves in a direction of an arrow with respect to the Y-axis, as in FIGS. 6A and 6B. In FIG. 7A, switching is performed such that each −A-phase (B-phase) coil is changed to the OFF state while each A-phase (−B-phase) coil is changed to the ON state. Then, the movable element 110 moves in a movable element moving direction indicated by the arrow (FIG. 7B). When the linear portions of each −B-phase coil and each B-phase coil come to immediately above magnets magnetized in the ±Z directions, each −B-phase (−A-phase) coil is switched to the OFF state while each B-phase (A-phase) coil is switched to the ON state. By repeating the same procedures, a force in the Z direction of a magnitude proportional to a command value can be generated regardless of position.

The above description has exemplified a case wherein the linear portions of coils are arranged parallel to the X-axis direction. The same applies to a coil array whose linear portion is parallel to the Y direction. This case can generate a translational force in the ±X directions and a levitation force in the ±Z directions each having a magnitude proportional to a command value regardless of position.

As can be seen from the above, the entire stator has three layers of coil arrays which generate a translational force in the ±X directions and a force in the ±Z directions and three layers which generate a translational force in the ±Y directions and a force in the ±Z directions. The movable element 110 can be translated, levitated, or rotated by forces with three degrees of freedom, i.e., in the X, Y, and Z directions alone or in combination.

More specifically, as shown in FIG. 2, the first coil array which is closest to the magnets and comprises almost oblong coils whose linear portions are parallel to the Y direction performs translation and levitation in the X-axis direction. The second coil array which is below and adjacent to the first coil array and comprises almost oblong coils whose linear portions are parallel to the X-axis direction performs translation and levitation in the Y-axis direction. The third coil array which is below and adjacent to the second coil array and comprises almost oblong coils whose linear portions are parallel to the Y direction performs translation and levitation in the X-axis direction.

Control for generating moments to control rotation will be described with reference to FIGS. 8 to 10.

Figure 8:
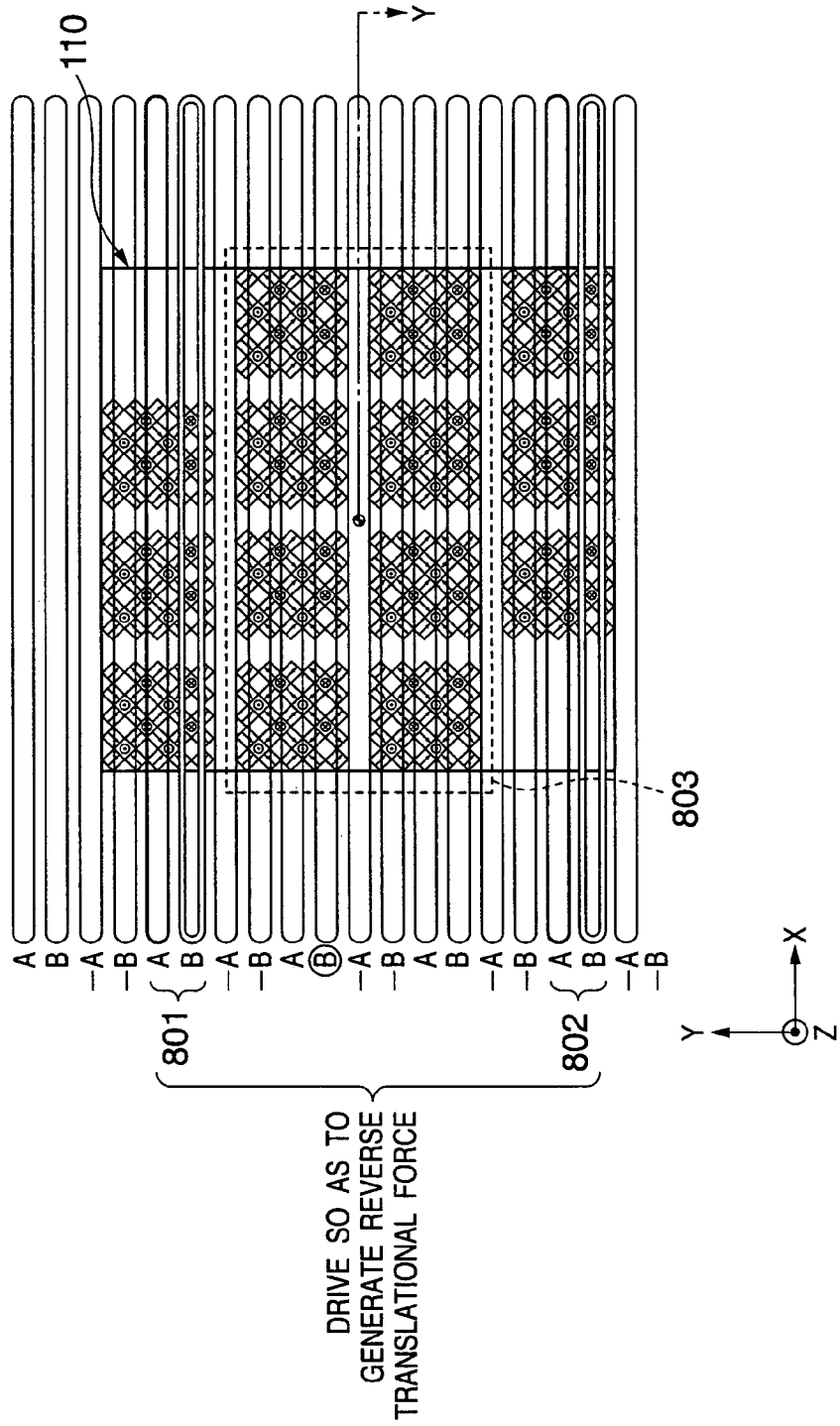
FIG. 8 is a view for explaining control for generating moments about the Z-axis to control rotation.

FIG. 8 is a view for explaining generation of moments about the Z-axis. In a layer comprising almost oblong coils whose linear portions are parallel to the X direction, a current is supplied to only coil segments (801 and 802) which face regions having defective portions out of the magnet-bearing surface of the movable element 110. In addition, coil energization control is performed such that translational forces in opposing directions are generated in the coil segments, respectively. The partial absence of magnets can cause the lines of action of the translational forces in the opposing directions to shift in the X direction, thereby generating moments about the Z-axis (ωz direction). More specifically, the moments about the Z-axis can be generated using the fourth coil array shown in FIG. 2. Current control and switching of coils are performed in the same manner as described above, and a description thereof will be omitted.

Figure 9:
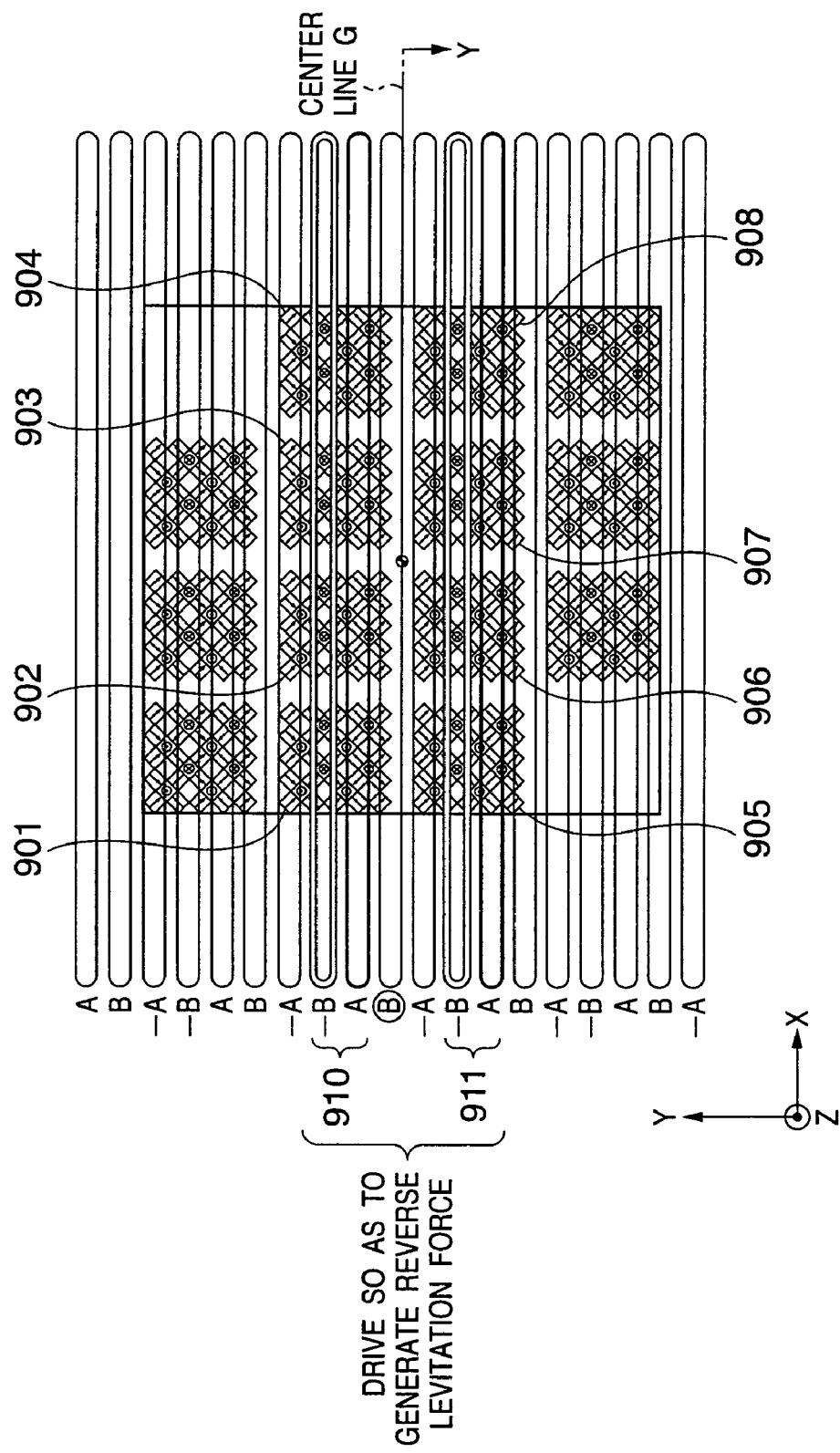
FIG. 9 is a view for explaining control for generating moments about the X-axis to control rotation.

FIG. 9 is a view for explaining generation of moments about the X-axis. In a layer comprising almost oblong coils whose linear portions are parallel to the X direction, only coil segments (910 and 911) which face a central portion free from a defective portion, but having eight small magnet units (901 to 908) out of the magnet-bearing surface of the movable element 110 are driven to generate a force in the ±Z directions. Coil energization control is so performed as to generate forces in the opposing Z directions centered on a center line G of the movable element. When the movable element shifts from the center line G in the Y direction, the forces in the opposing Z directions cause moments for rotating the movable element 110 about the X-axis (ωx direction). More specifically, the moments about the X-axis can be generated using the sixth coil array shown in FIG. 2.

FIG. 10 is a view for explaining generation of moments about the Y-axis. In a layer comprising almost oblong coils whose liner portions are parallel to the Y direction, only coil segments (1010 and 1012) which face a central portion free from a defective portion, but having eight small magnet units (1001 to 1008) out of the magnet-bearing surface of the movable element 110 are driven to generate a force in the ±Z directions. Coil energization control is so performed as to generate forces in the opposing Z direction with respect to a center line G of the movable element. When the movable element shifts from the center line G in the X direction, the forces in the opposing Z directions cause moments for rotating the movable element 110 about the Y-axis (ωy direction). More specifically, the moments about the Y-axis can be generated using the fifth coil array shown in FIG. 2.

Each of the forces in six axial directions has a magnitude proportional to the current and can isolate vibrations between the movable element and the stator.

A flat motor can comprise the movable element 110 which comprises only the top plate 112 and magnet arrays 114 asymmetrically arranged on the top plate and the stator 100, in which the (first to sixth) coil arrays formed by a plurality of coil layers comprising the almost oblong coils 116 whose linear portions are parallel to the X or Y direction are fastened to the base 118. Controlling a current to be supplied to the coil arrays in this flat motor can provide the movable element 110 with a Lorentz force with six degrees of freedom. This force is used as a driving force for performing translation, levitation, or posture control for the movable element. The position detectors 520 (520a to 520c) and posture detectors 530 (530a to 530c) shown in FIG. 5B measure the position and posture of the movable element 110 and feed them back to the current controller 500. This makes it possible to control the position and posture at high accuracy as desired.

As described above, this embodiment can directly generate thrusts and moments in directions with six degrees of freedom and eliminates the need for guiding power cables. This can provide an alignment apparatus which does not use the air pressure to levitate the movable element. Disturbance caused by guiding power cables can be eliminated, thereby allowing high-accuracy alignment in six axial directions.

<Explanation of Modification>

Figure 11A:
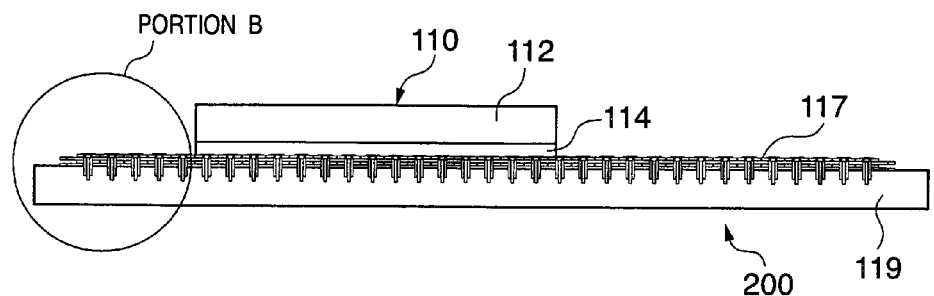
FIGS. 11A and 11B are views showing a modification of the embodiment wherein coil arrays are stacked in a different manner.
Figure 11B:
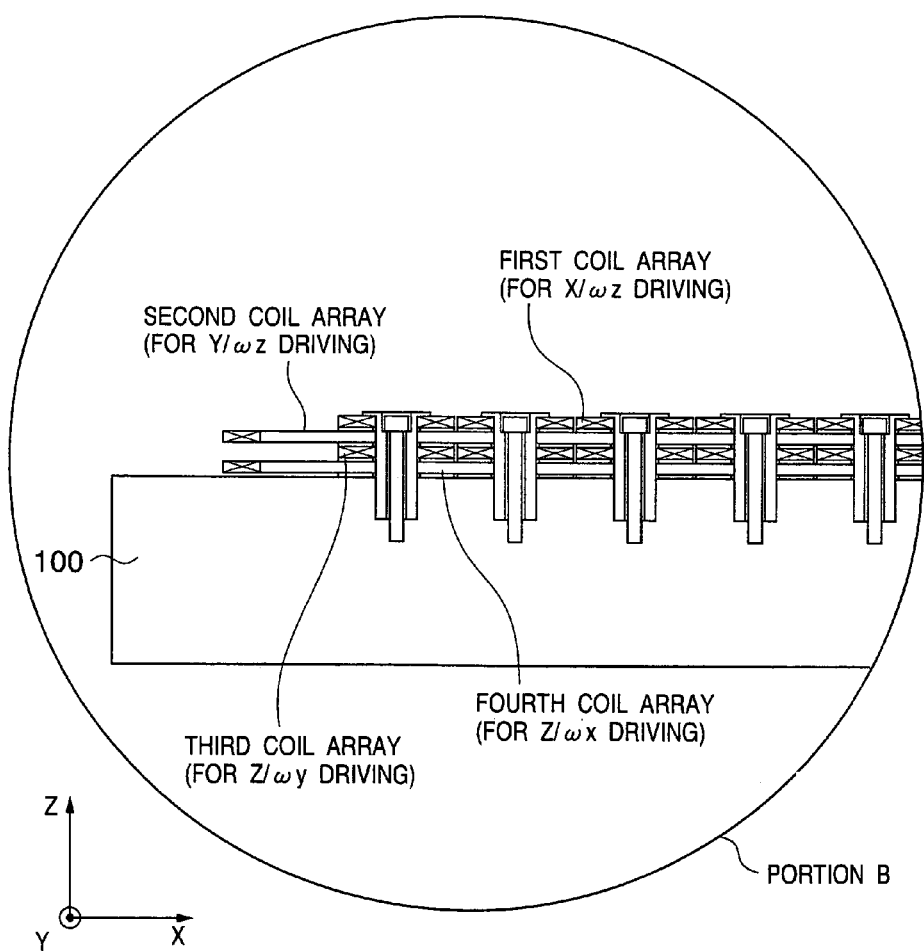

FIGS. 11A and 11B are views showing a modification of the above-mentioned embodiment. The movable element 110 is assumed to have the same arrangement as that of the embodiment. This modification is different from the embodiment in that a stator 200 has four layers of coil arrays, as shown as an enlarged view of coil arrays 117 in FIG. 11B. The modification has four layers in total: two layers each comprising almost oblong coils whose linear portions are parallel to the X direction; and two layers each comprising almost oblong coils whose linear portions are parallel to the Y direction. The embodiment has the six separate layers as coil arrays to generate forces with six degrees of freedom while this modification has four layers each of which generates forces with two degrees of freedom.

FIG. 12 is a view for explaining control of rotational driving about the Z-axis. A current to be supplied to a coil layer comprising almost oblong coils whose linear portions are parallel to the X direction, i.e., the second coil array in FIGS. 11A and 11B is controlled such that only coils (1220 and 1230) which face the movable element 110 are driven using the coil array and that separate translational forces are generated with respect to a center line G in the upper and lower halves of the movable element 110, respectively. The sum of components in translational directions of forces generated by control currents to be supplied to the coil 1220 corresponding to the upper half of the movable element 110 and the coil 1230 corresponding to the lower half becomes a translational force in the Y direction.

The first translational force (Y-axis) in a translational Y-axis direction is generated by the coil array 1220 which faces small magnet units (1201 to 1207) on the upper half of the movable element 110, and the second translational force (Y-axis) in the translational Y-axis direction is generated by the coil array 1230 which faces small magnet units (1208 to 1214) on the lower half. The presence of defective portions causes the lines of action of the first translational force (Y-axis) and the second translational force (Y-axis) to shift in the X direction. Hence, a difference between the first translational force (Y-axis) and the second translational force (Y-axis) acts as a couple of forces to generate rotation moments about the Z-axis.

Figure 14:
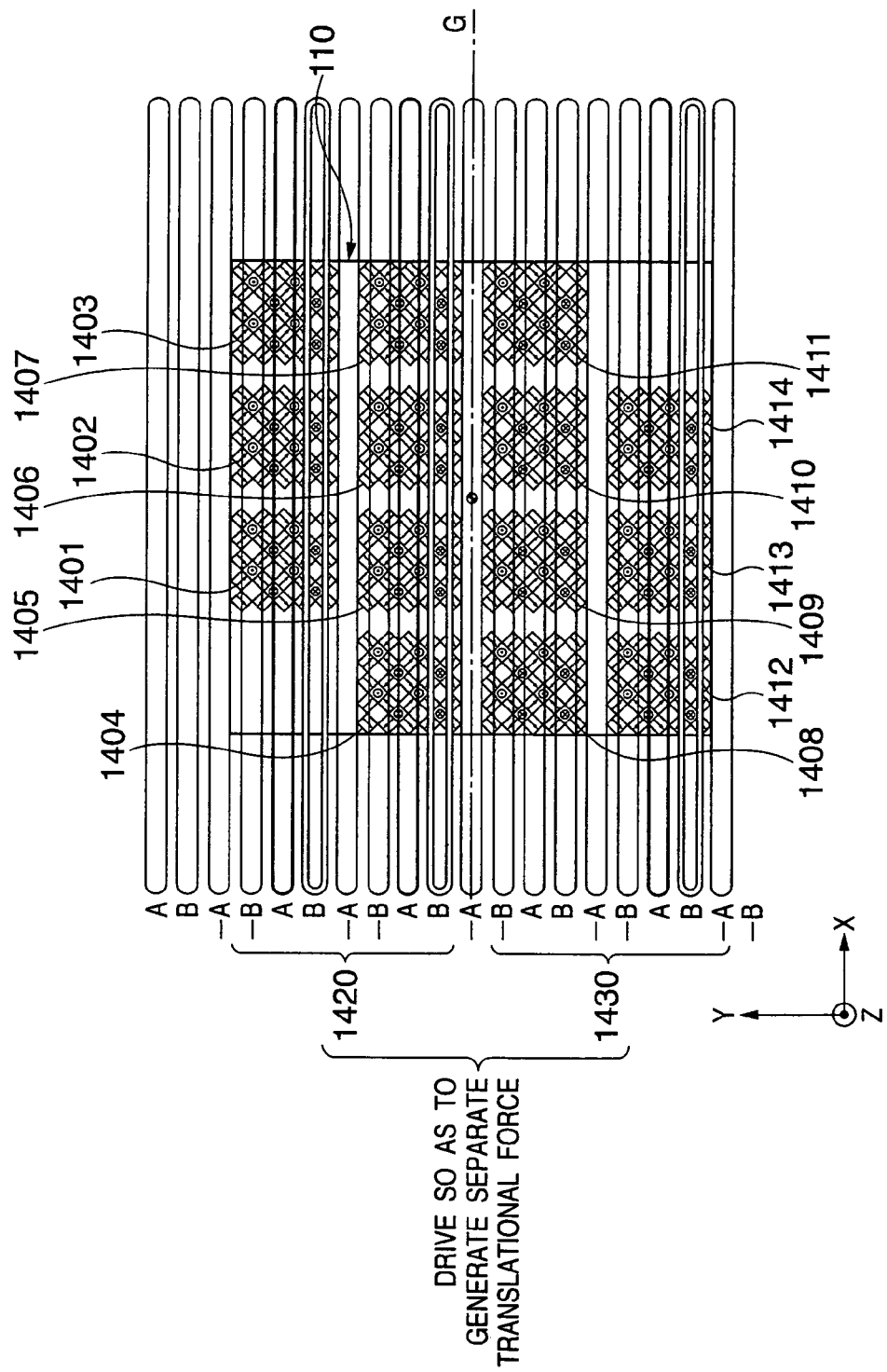
FIG. 14 is a view for explaining control of translational driving in the X-axis direction and rotational driving about the Z-axis in the modification.

FIG. 14 is a view for explaining control of translational driving in the X-axis direction and rotational driving about the Z-axis. A current to be supplied to a coil layer comprising almost oblong coils whose linear portions are parallel to the Y direction, i.e., the first coil array in FIG. 11B is controlled such that only coils (1420 and 1430) which face the movable element 110 are driven using the coil array and that separate translational forces are generated with respect to a center line G in the upper and lower halves of the movable element 110, respectively. The sum of components in translational directions of forces generated by control currents to be supplied to the coil 1420 corresponding to the upper half of the movable element 110 and the coil 1430 corresponding to the lower half becomes a translational force in the X direction.

The first translational force (X-axis) in a translational X-axis direction is generated by the coil array 1420 which faces small magnet units (1401 to 1407) on the upper half of the movable element 110, and the second translational force (X-axis) in the translational X-axis direction is generated by the coil array 1430 which faces small magnet units (1408 to 1414) on the lower half. The presence of defective portions causes the lines of action of the first translational force (X-axis) and the second translational force (X-axis) to shift in the Y direction. Hence, a difference between the first translational force (X-axis) and the second translational force (X-axis) acts as a couple of forces to generate rotation moments about the Z-axis.

FIG. 13 is a view for explaining control of translational (levitation) driving in the Z-axis direction and rotational driving about the X-axis. A current to be supplied to a coil layer comprising almost oblong coils whose linear portions are parallel to the X direction, i.e., the fourth coil array in FIG. 11B, is controlled such that only coils (1320 and 1330) which face the movable element 110 are driven using the coil array and that separate levitation forces are generated with respect to a center line G in the upper and lower halves of the movable element 110, respectively. The sum of components in the Z direction of forces generated by control currents to be supplied to the coil 1320 corresponding to the upper half of the movable element 110 and the coil 1330 corresponding to the lower half becomes a levitation force in the Z direction.

The first levitation force in the Z-axis direction is generated by the coil array 1320 which faces small magnet units (1301 to 1307) on the upper half of the movable element 110, and the second levitation force in the Z-axis direction is generated by the coil array 1330 which faces small magnet units (1308 to 1314) on the lower half. The presence of defective portions causes the lines of action of the first levitation force and the second levitation force to shift in the Y direction. Hence, a difference between the first levitation force and the second levitation force acts as a couple of forces to generate rotation moments about the X-axis.

FIG. 15 is a view for explaining control of translational (levitation) driving in the Z-axis direction and rotational driving about the Y-axis. A current to be supplied to a coil layer comprising almost oblong coils whose linear portions are parallel to the Y direction, i.e., the third coil array in FIG. 11B is controlled such that only coils (1520 and 1530) which face the movable element 110 are driven using the coil array and that separate levitation forces are generated with respect to a center line G in the upper and lower halves of the movable element 110, respectively. The sum of components in the Z direction of forces generated by control currents to be supplied to the coil 1520 corresponding to the upper half of the movable element 110 and the coil 1530 corresponding to the lower half becomes a levitation force in the Z direction.

The third levitation force in the Z-axis direction is generated by the coil array 1520 which faces small magnet units (1501 to 1507) on the upper half of the movable element 110, and the fourth levitation force in the Z-axis direction is generated by the coil array 1530 which faces small magnet units (1508 to 1514) on the lower half. The presence of defective portions causes the lines of action of the third levitation force and the fourth levitation force to shift in the X direction. Hence, a difference between the third levitation force and the fourth levitation force acts as a couple of forces to generate rotation moments about the Y-axis.

According to the arrangement described in this modification, the number of coil layers on the stator side can be reduced. From another point of view, if the cross-sectional area of six coil layers falls within the tolerance, the cross-sectional coil area per layer can be increased by a factor of 1.5 (=six layers/four layers). This can decrease the resistance of coils and then the amount of heat generated upon supplying a current to the coils.

<Application to a Semiconductor Exposure Apparatus>

Reference numeral 1601*a* denotes a view showing the arrangement in which a twin-stage alignment apparatus comprising two movable elements and a stator according to the arrangement of the above-mentioned embodiment or modification is applied to a semiconductor exposure apparatus. Reference numeral 1601*b* in FIG. 16A denotes a view showing a state wherein two movable elements 1630*a* and 1630*b* are aligned within a plane on a coil array 1640 of a stator 1660. A wafer chuck (not shown) is mounted on each of the movable elements 1630*a* and 1630*b*, and a wafer as an object to be exposed is placed on the wafer chuck. Mirrors (not shown) are arranged on the side and upper surfaces of the top plate (corresponding to the top plate 112 in FIG. 1) of each of the movable elements 1630*a* and 1630*b* to detect the position and posture of the movable element. For example, use of a laser interferometer can measure the position and posture of the movable element with six degrees of freedom (the measurement means (520*a* to 520*c* and 530*a* to 530*c*) shown in FIG. 5B).

The entire semiconductor exposure apparatus comprises a measurement region 1670 which measures by a measurement optical system 1610 the position of an exposure pattern exposed by an exposure optical system 1620 and an exposure region 1680 which exposes a wafer to a semiconductor circuit pattern by the exposure optical system 1620. A means (not shown) for loading/unloading a wafer into/from the semiconductor exposure apparatus is arranged on the left side of the measurement region 1670. As indicated by an arrow in the view 1601*a* of FIG. 16A, the apparatus is arranged to perform loading/unloading of the wafer in the measurement region 1670.

The movable elements 1630*a* and 1630*b* have the same arrangement as that of the embodiment. The principle of force generation of the coil array 1640 of the stator 1660 is the same as that of the embodiment. The apparatus is characterized by its arrangement and can implement both a function of freely moving and aligning the two movable elements 1630*a* and 1630*b* in each of the measurement region 1670 and exposure region 1680 and a function of moving the two movable elements 1630*a* and 1630*b* from the exposure region 1680 to the measurement region 1670 or from the measurement region 1670 to the exposure region 1680.

The stator has a stacked structure of four or six coil layers each comprising almost oblong coils, similar to the embodiment and modification.

Figure 16A:
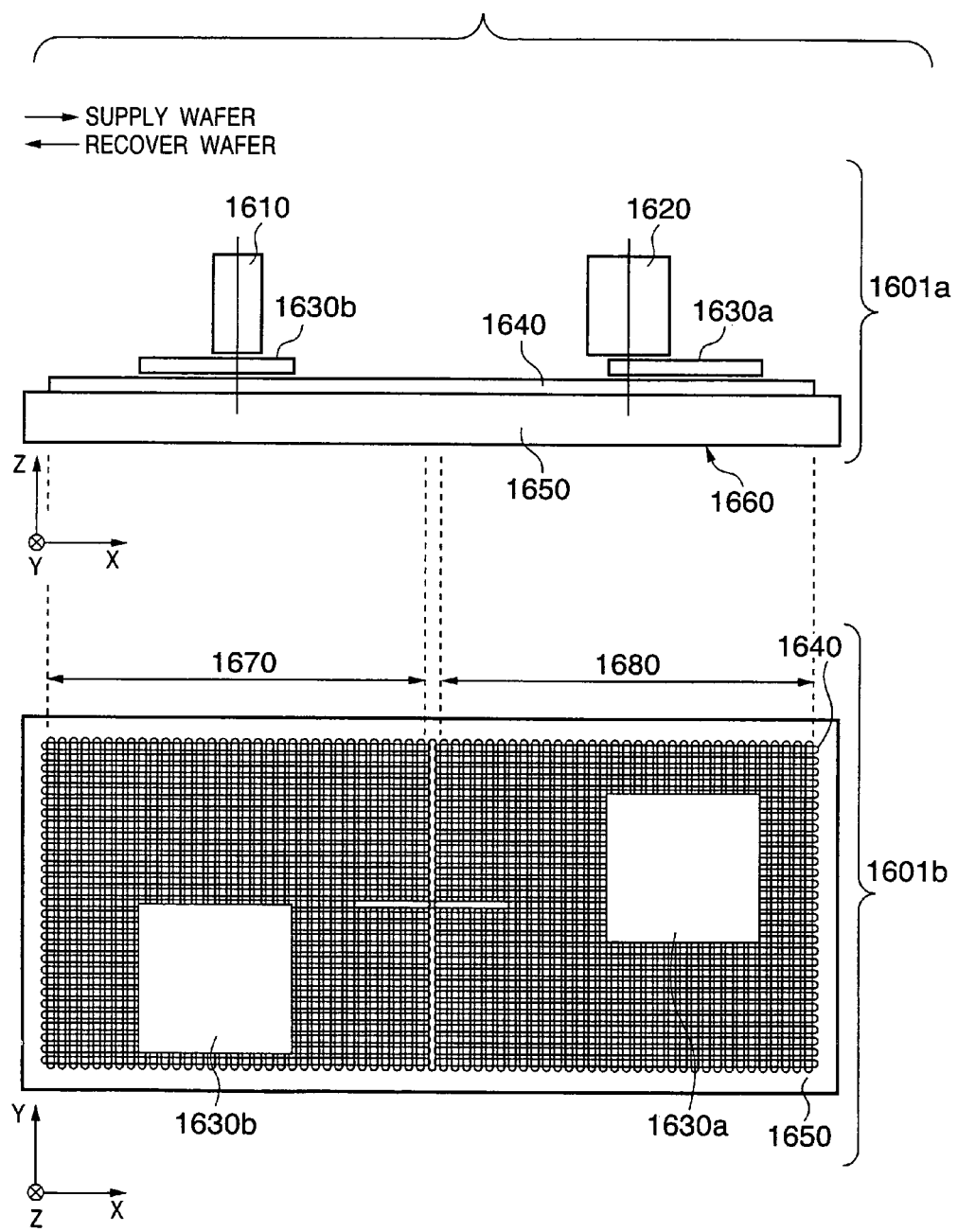
FIG. 16A is a view showing an arrangement wherein a twin-stage alignment apparatus having two movable elements and a stator according to the arrangement of the embodiment or modification is applied to a semiconductor exposure apparatus.
Figure 17A:
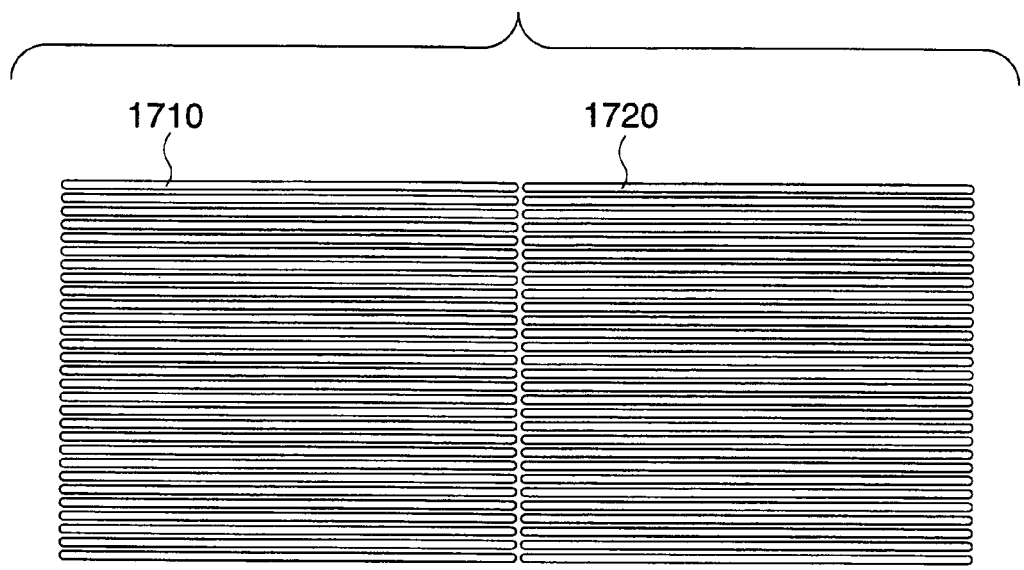
FIGS. 17A and 17B are views for explaining the arrangements of coil arrays for driving the twin stage in application to the semiconductor exposure apparatus.

As shown in FIG. 17A, a layer comprising almost oblong coils whose linear portions are parallel to the X direction is divided into two, left and right portions to correspond to the measurement region 1670 and exposure region 1680 in the view 1601*b* of FIG. 16A. This division into the two portions makes it possible to separately control the forces in six axial directions for each of the two movable elements 1630*a* and 1630*b* even when they are horizontally aligned in the plane.

When the layer is not horizontally divided into two portions, and the two movable elements 1630*a* and 1630*b* are horizontally aligned, they share almost oblong coils whose linear portions are parallel to the X direction. This disables independent control of the forces in the six axial directions for each of the movable elements 1630*a* and 1630*b*. In the semiconductor exposure apparatus, when the two movable elements are independently moved in the exposure region 1680 and measurement region 1670, they may horizontally be aligned. For this reason, in a coil array layer comprising almost oblong coils whose linear portions are parallel to the X direction, as shown in FIG. 17A, division of the almost oblong coils into two right and left portions is absolutely required to independently control the two movable elements.

Figure 17B:
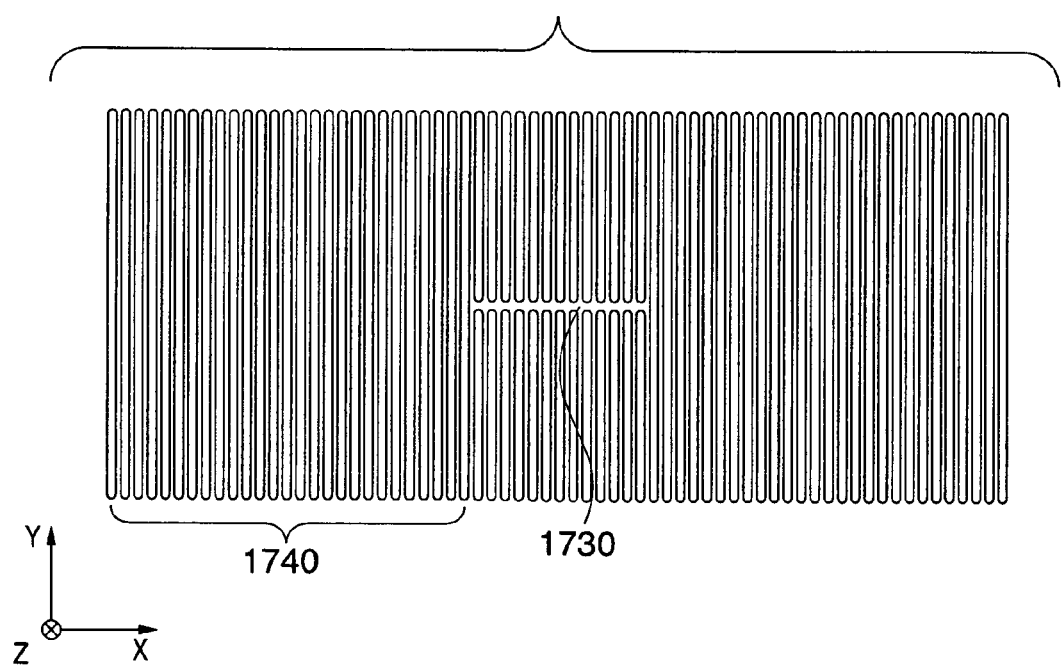

As shown in FIG. 17B, a layer comprising almost oblong coils whose linear portions are parallel to the Y direction has a region 1730 in which the linear portions of coils are vertically divided into two portions. In the region 1730, in which the coils are vertically divided into two portions, the forces in the six axial directions for each of the two movable elements 1630a and 1630b can independently be controlled when the two movable elements are vertically aligned, i.e., their X-coordinates are almost the same, and their Y-coordinates are different from each other. For example, in a region like a region 1740 in which almost oblong coils whose linear portions are parallel to the Y direction are not vertically divided into two portions, when the two movable elements are aligned horizontally in the Y direction, they share coils whose linear portions face the movable elements. This disables independent control of the forces generated by the coils and then separate control of the forces in the six axial directions for each of the movable elements.

When the two movable elements are moved from the exposure region 1680 to the measurement region 1670 or from measurement region 1670 to the exposure region 1680, a situation in which the two movable elements are aligned vertically in the Y direction may occur inevitably. For this reason, to generate a force which allows the two movable elements to move independently in the X direction, the region 1730, in which almost oblong coils whose linear portions are parallel to the Y direction are vertically divided into two portions, as shown in FIG. 17B, is absolutely necessary.

Operation of the movable elements 1630a and 1630b will be described with reference to FIGS. 18A to 20B.

Figure 18A:
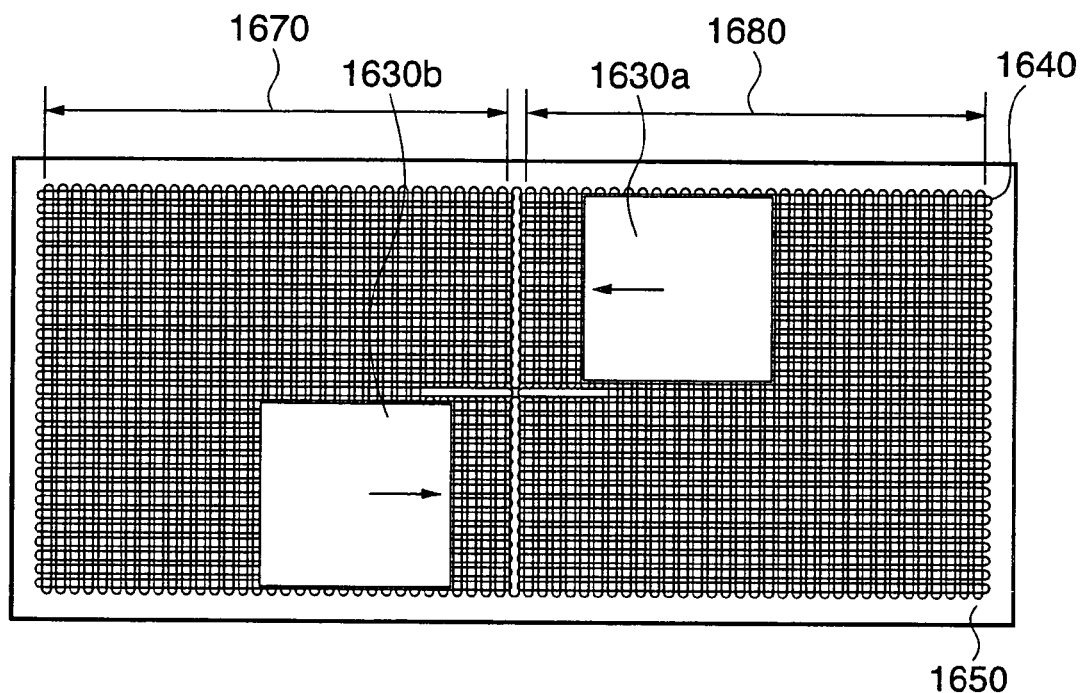
FIGS. 18A and 18B are views for explaining operation of the twin stage in an application to the semiconductor exposure apparatus.

In FIG. 18A, the first movable element 1630a is located in the exposure region 1680, and the second movable element 1630b is located in the measurement region 1670. A wafer being exposed is placed on the first movable element 1630a. The first movable element 1630a performs operation of aligning/transporting the wafer with/to a predetermined position in the exposure region. The exposure optical system 1620 exposes the wafer on the first movable element 1630a in the exposure region 1680. An exposed wafer is placed on the second movable element 1630b. The measurement optical system 1610 measures the position of a pattern on the exposed wafer in the measurement region 1670. When a wafer unloading means (not shown) unloads the exposed wafer after the measurement, a wafer loading means (not shown) loads a wafer to be exposed into a wafer chuck (not shown) on the second movable element 1630b.

Figure 18B:
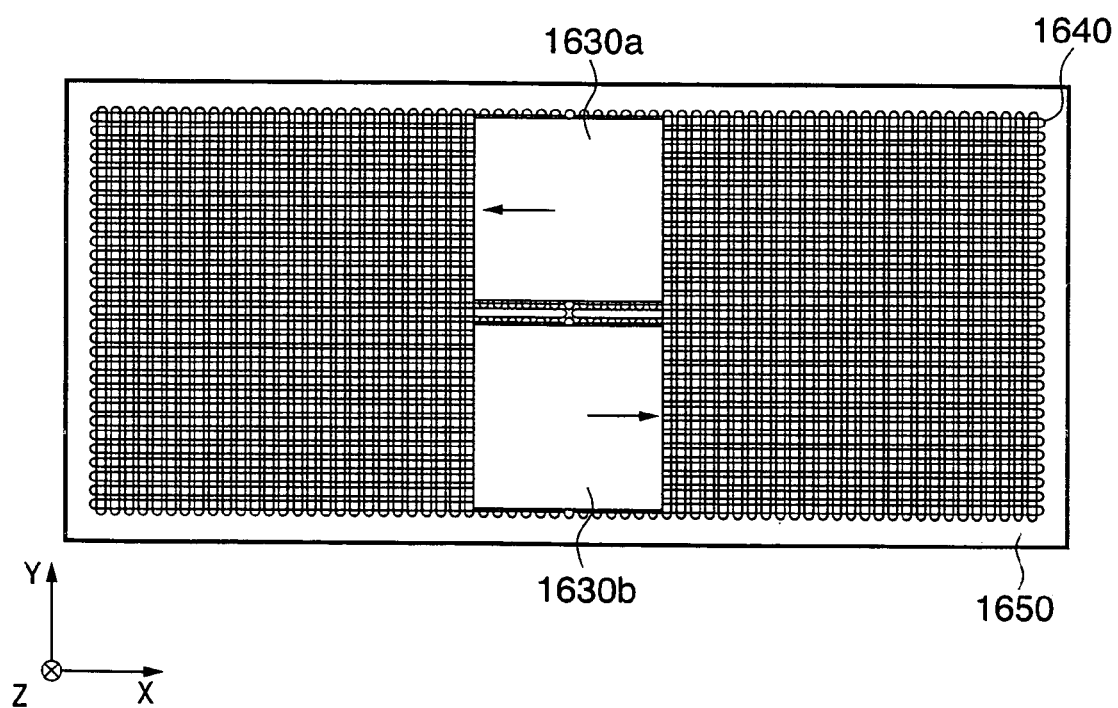

When the exposure process in the exposure region 1680 is completed by driving the movable element 1630a, and the measurement process in the measurement region 1670 is completed by driving the second movable element 1630b, wafer unloading and loading are independently performed. After that, the movable elements 1630a and 1630b move to the measurement region 1670 and exposure region 1680, respectively. When the movable elements 1630a and 1630b pass by each other, as shown in FIG. 18A, the first movable element 1630a moves upward while the second movable element 1630b moves downward so as to prevent collision. At this time, each of the first movable element 1630a and second movable element 1630b may take the reverse refuge route. As shown in FIG. 18B, the first movable element 1630a so moves as to pass by on the upper side of the vertically divided coils shown in FIG. 17B, and the second movable element 1630b so moves as to pass by on the lower side of the vertically divided coils. At this time, the two movable elements desirably pass by each other to have almost rotational symmetry.

Figure 19:
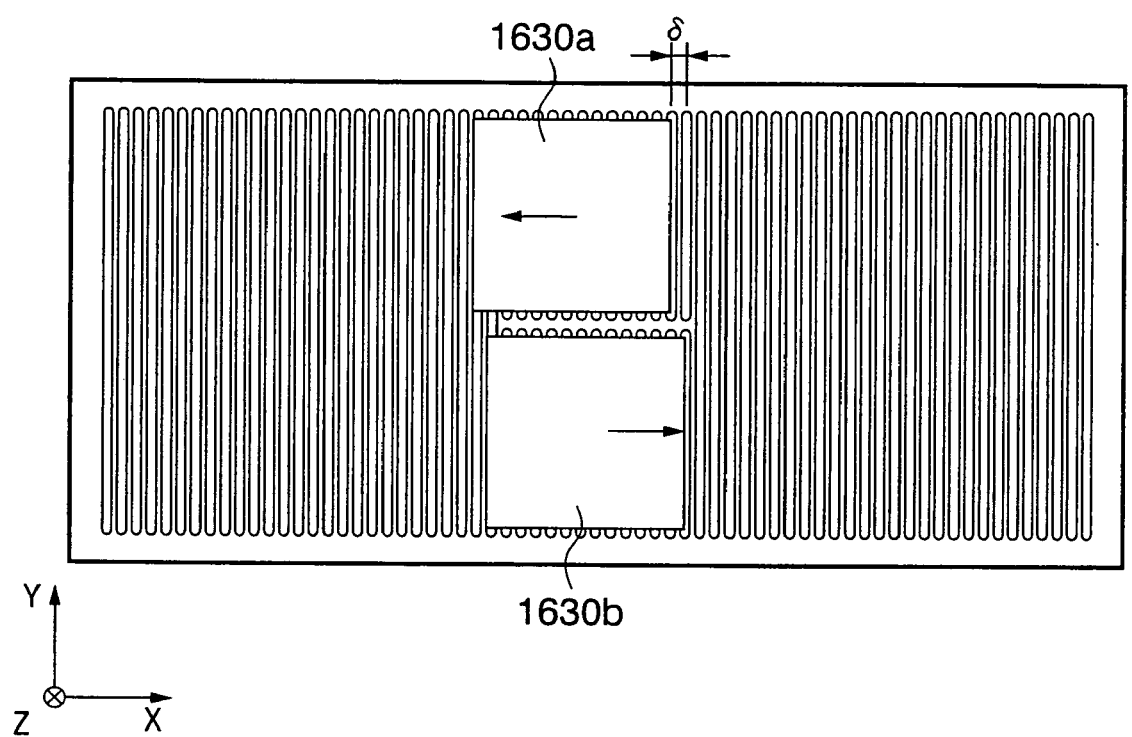
FIG. 19 is a view for explaining operation of the twin stage in an application to the semiconductor exposure apparatus.

For example, as shown in FIG. 19, assume that the two movable elements do not have almost rotational symmetry in a positional relationship between the coil array layer in FIG. 17B and the movable elements. In this case, the upper and lower movable elements have a deviation ($\delta$). If one of the movable elements enters the driving force region of the other movable element, the two movable elements are present in the region of the coil array which generates the same driving force. This disables independent control of stages. To prevent such a state, the movable elements 1630a and 1630b are controlled to wait until they enter the states shown in FIGS. 18A and 18B.

After the movable elements 1630 pass by each other, the second movable element 1630b enters the exposure region 1680 and starts exposure processing. In the measurement region 1670, the wafer on the first movable element 1630a is measured by the measurement optical system 1610. The wafer having undergone the measurement is unloaded from the wafer chuck (not shown), and a new wafer is loaded. Measurement and exposure are performed on the basis of the independent driving of the two movable elements. When the above-mentioned arrangement is employed, wafers are placed on the movable elements, respectively. This allows parallel processing of exposure and pattern position measurement and an increase in productivity of semiconductor exposure apparatuses.

<Modification of Layout of Movable Element Magnets>

Figure 20A:
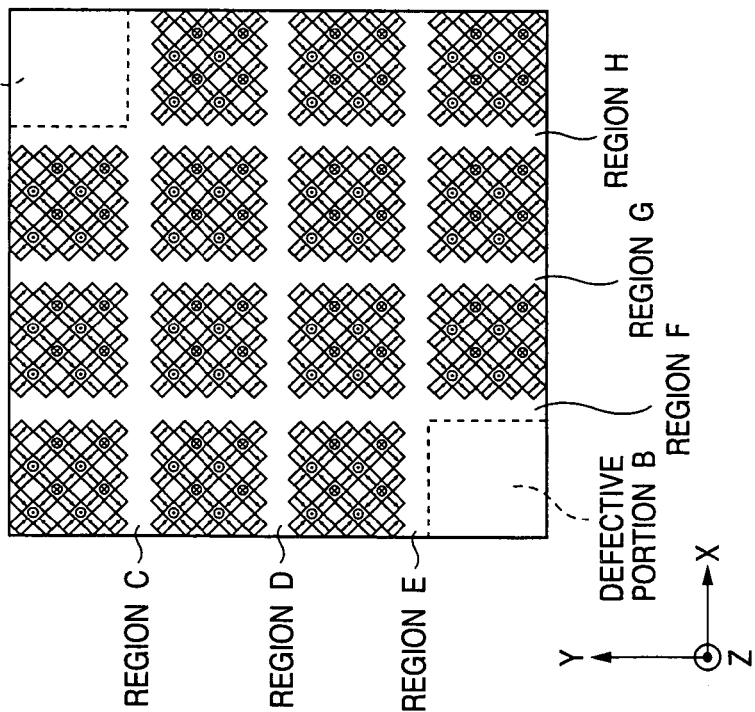
FIGS. 20A and 20B are views showing modifications of the arrangement of movable element magnets.
Figure 20B:
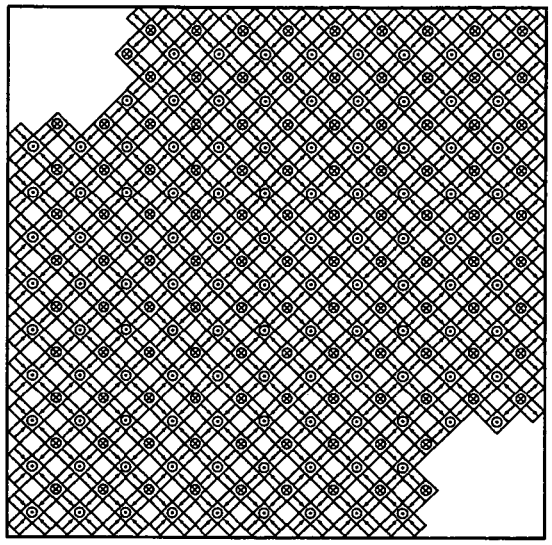

FIGS. 20A and 20B, and 21A and 21B are views showing modifications of the layout of magnets arranged on a movable element. FIG. 20A shows the arrangement described in the embodiment, which has the defective portions A and B, and regions C to H. Magnets may be arranged in the regions C to H, as shown in FIG. 20B. In this case as well, control for driving the movable element is the same as described above. In the magnet arrangement (FIG. 20A) according to the embodiment, magnets are divided into small magnet units each comprising 33 magnets. In the arrangement of FIG. 20A, magnetic fluxes decrease in each edge portion of each small magnet unit. In the arrangement of FIG. 20B, the edge portions of the small magnet units are eliminated by filling the linear regions C to H with magnets. This prevents a decrease in magnetic fluxes in each edge portion of each small magnet unit. The uniformity of forces generated between movable element magnets and stator coils can be increased.

FIGS. 21A and 21B are views showing other modifications of the layout of movable element magnets. In the arrangement (FIG. 4B) described in the above-mentioned embodiment, the defective portions A and B are arranged in the upper right and lower left corners on a diagonal line to generate rotation moments about the Z-axis. The positions of defective portions are not limited to those shown in FIG. 4B. For example, in FIG. 21A, defective portions (2110a and 2110b) are arranged at positions shifted inward in a movable element plane. Alternatively, defective portions may be arranged at positions indicated by 2110c and 2110d, respectively, i.e., positions not on a diagonal line in a movable element plane.

As described above, even when defective portions are arranged at different positions, in a certain layer, translational forces in opposing directions by supplying currents in opposing directions to a coil array which faces two defective portions or separate translational forces are generated on the upper and lower halves of a movable element with respect to the center line, similar to the embodiment. With this operation, rotation moments about the Z-axis can be generated by separately controlling currents to be supplied to coil arrays.

Figure 27:
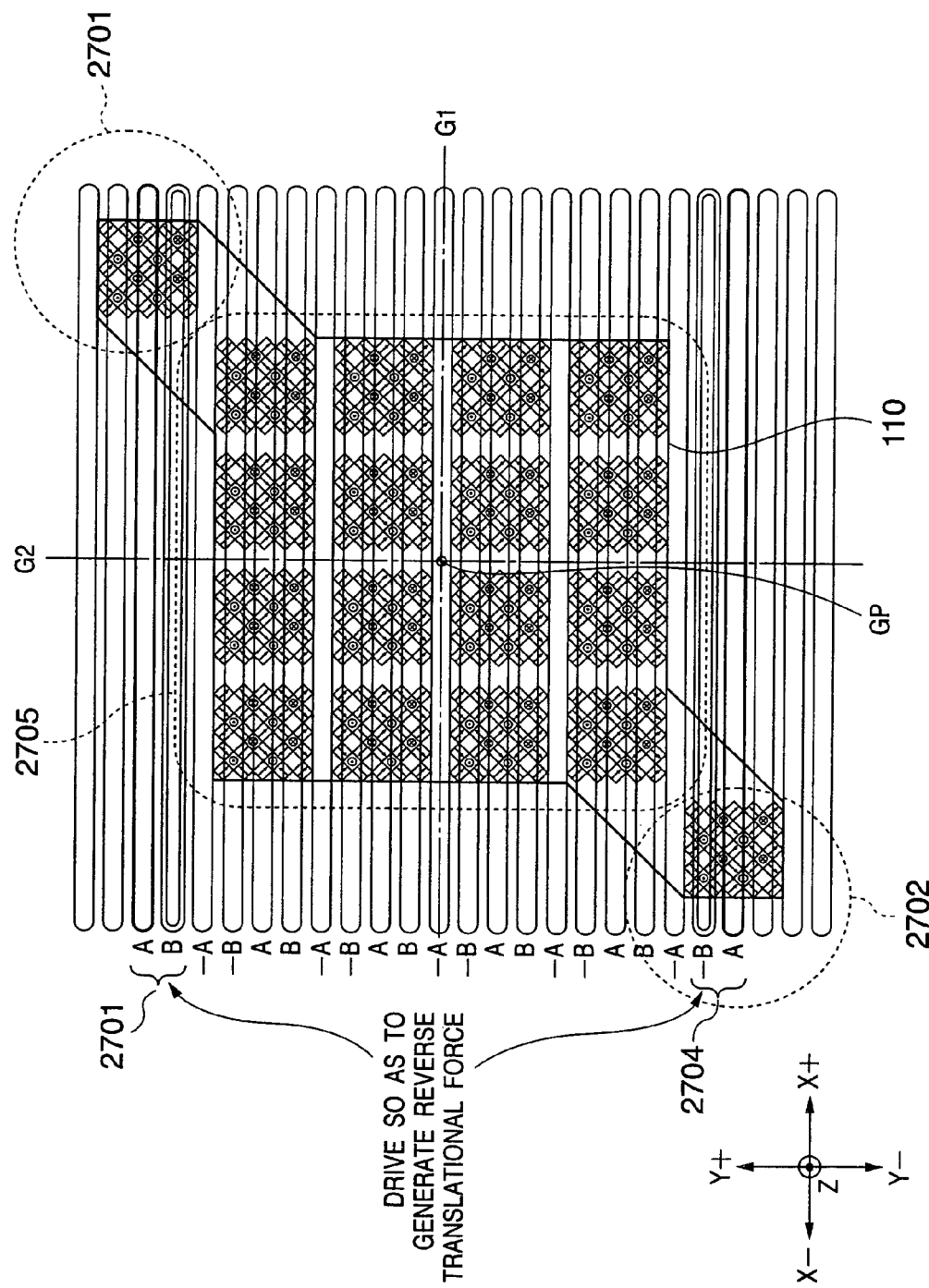
FIG. 27 is a view showing another modification of the arrangement of movable element magnets.

FIG. 27 is a view showing another modification of the layout of movable elements. In the foregoing description, cases are exemplified as modifications of the layout of magnets wherein defective portions are arranged differently. The modification shown in FIG. 27 has no defective portion but has projecting regions (2701 and 2702) on a movable element. Movable element magnets are arranged in these regions (to be referred to as "projecting regions" hereinafter).

In a layer comprising almost oblong coils whose linear portions are parallel to the X direction, a current is supplied to only coil segments (2703 and 2704) which face regions having projecting regions out of the magnet-bearing surface of the movable element 110. In addition, coil energization control is performed such that translational forces in opposing directions are generated in the coil segments, respectively. Since the projecting regions 2701 and 2702 are shifted in the X and Y directions and are arranged at different X- and Y-coordinates, reverse translational forces act. This can generate moments about the Z-axis ($\omega z$ direction). Current control and switching of coils are performed in the same manner as described above, and a description thereof will be omitted.

Additionally, the actions of moments about other driving axes ($\omega x$ and $\omega z$) are as described above, and a description thereof will be omitted. An arrangement which has projecting regions, as shown in FIG. 27, and controls forces by movable element magnets arranged on these regions to generate moments for controlling the posture of the movable element 110 increases the utilization efficiency of coils on the stator side and reduces the amount of heat generated by coil energization. These effects are unique to this modification.

According to the arrangement shown in FIG. 27, all movable element magnets arranged in a region other than the projecting regions of the movable element 110, i.e., a central square region 2705 (the first region) can be used to drive the movable element 110 in a translational direction. Assume that coils (2703 and 2704) which face the projecting region (2701: the second region) and the projecting region (2702: the third region) perform rotation about the Z-axis, and coils which face the central square region 2705 (the first region) perform translational driving. If the arrangement (FIG. 27) of movable element magnets in which separate groups of coils contribute to rotation about the Z-axis and translational driving generate the same driving force as an example in which defective portions are present among the movable element magnets (e.g., FIG. 8), the amount of heat generated by coils reduces to ½. In the example in which defective portions are present among the movable element magnets (e.g., FIG. 8), the number of movable element magnets in the region 803 (FIG. 8) without any defective portion is half that of movable element magnets arranged in the square region 2705. To generate the same driving force as that obtained by the arrangement of FIG. 8 using the arrangement of FIG. 27, the coil resistance (R) of movable element magnets increases twice while the current (I) decreases to ½. Consequently, the amount of heat ($Q=I^2 \cdot R$) of all the coils decreases to ½.

FIGS. 28 and 29 show other arrangements in which projecting regions are arranged at different positions. In the arrangement shown in FIG. 28, projecting portions (2801 and 2802) are shifted from those of the arrangement shown in FIG. 27 by X1 in the –X direction and X1 in the +X direction, respectively. In the arrangement of FIG. 29, projecting portions (2901 and 2902) are shifted from those of the arrangement shown in FIG. 28 by X2 in the –X direction and X2 in the +X direction, respectively. When the positions of the projecting regions are so shifted as to approach a central axis (center of gravity) G2 in the Y-axis direction, the moments of inertia about the Y-axis of the movable element 110 can be reduced. This relationship can also be obtained by bringing projecting regions close to the central axis in the X-axis direction. Even when moments for causing rotation are small, posture control can effectively be performed by reducing the moments of inertia. Also, even when projecting regions as shown in FIGS. 28 and 29, driving control is performed and the amount of heat generated in the driving control decreases, in the same manner as that in FIG. 27.

As described above, when movable element magnets for generating moments about the Z-axis to control the posture are to be arranged, defective portions may be provided in the plane surface of a movable element or projecting regions may be provided, as shown in FIGS. 27 to 29. Projecting regions need to have arrays of magnets which face stator coils, and each array needs to have an array interval equal to that of movable element magnets arranged in the square region 2705 (the first region). The planar shape of the movable element 110 within a movable plane, which has projecting regions, is asymmetric, i.e., linearly asymmetric with respect to axes (G1 and G2) passing through the central portion (center of gravity) GP of the square region 2705 (the first region) and is almost rotationally symmetric with respect to the central portion GP. A rotationally symmetric shape is preferable because the rotation center and the position of the center of gravity readily coincide with each other.

<Structure for Cooling Coils>

In the above-mentioned embodiment, modification, application to the semiconductor exposure apparatus, each movable element magnet generates translational, levitation, and rotational driving forces by a magnetic force generated by a predetermined control current supplied to a stator coil array. Since each of these driving forces is generated by a Lorentz force, the amount of heat increases with an increase in load on coils. Cooling coils to remove generated heat allow a large current to flow in coils. In addition, thermal disturbance can be reduced in a measurement environment for measuring the position of a movable element.

Figure 22:
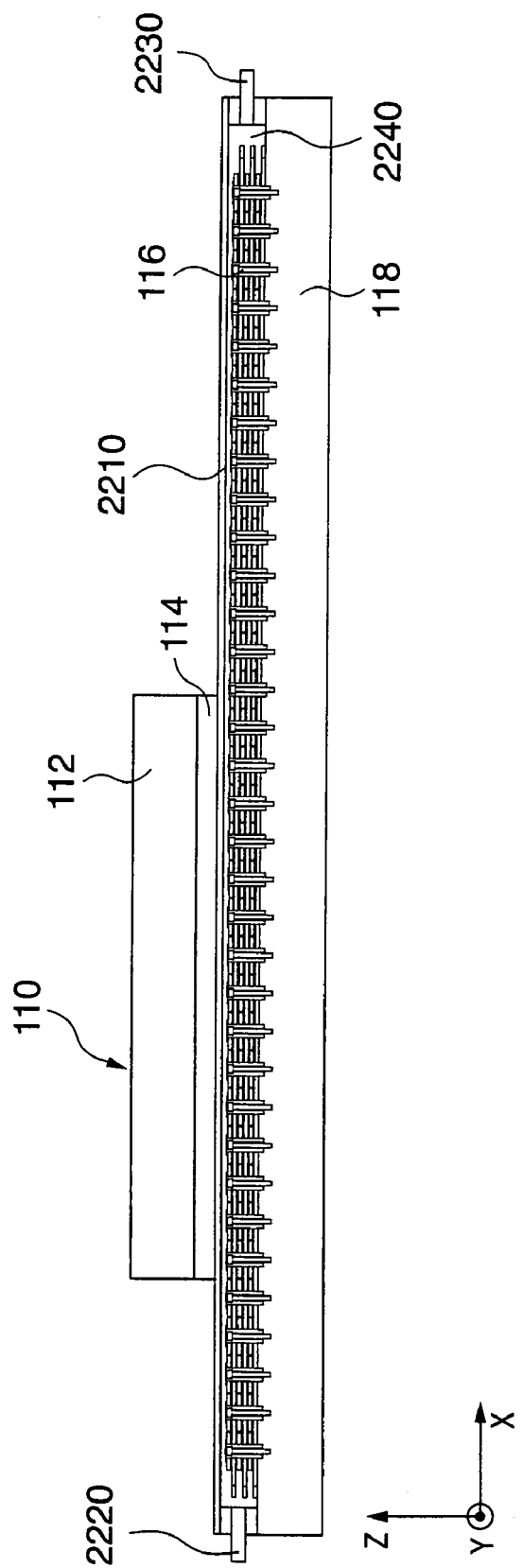
FIG. 22 is a view showing a structure for cooling coils.

FIG. 22 is a view showing the arrangement which directly cools coils by a coolant 2240. In addition to the arrangement according to the embodiment, a partition 2210 with which the coil arrays 116 are enclosed and which are isolated from the base 118 is provided. The inside of the partition is filled with a coolant 2240 such as Florinert (trademark), pure water, or the like. The coolant 2240, which has been temperature-controlled by a circulating system (not shown), circulates from a coolant inlet 2220 toward a coolant outlet 2230. Directly cooling the coil arrays 116 by the coolant 2240 can effectively reduce a rise in temperature of the coils.

Figure 23:
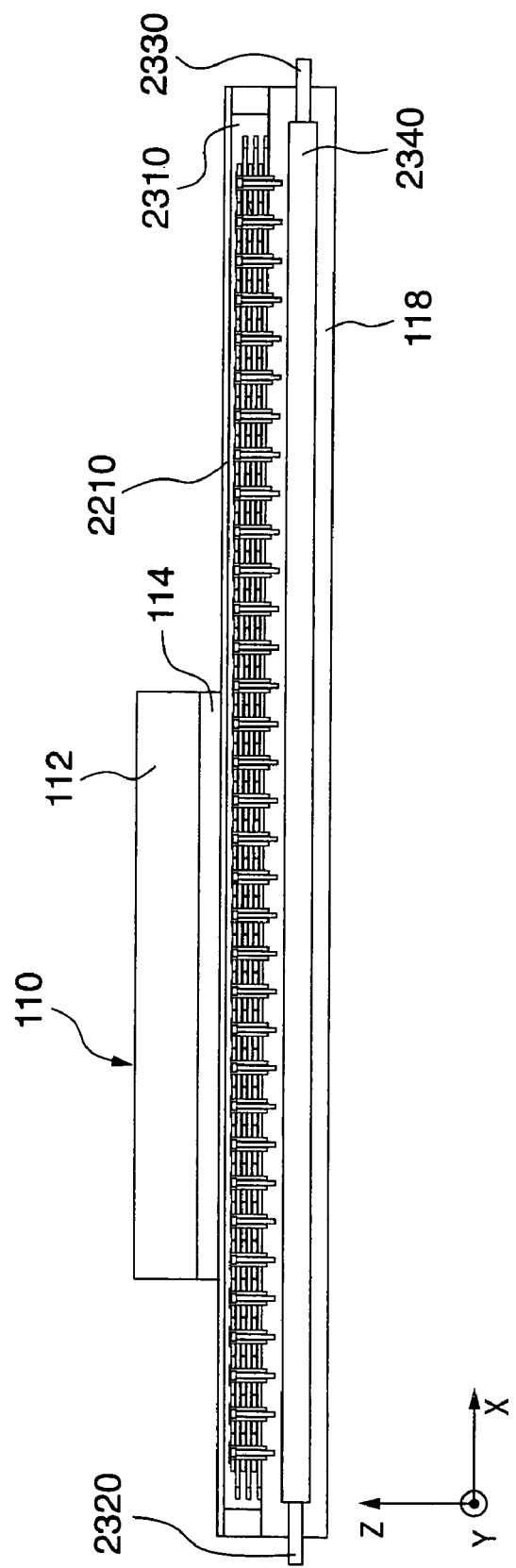
FIG. 23 is a view showing a structure for cooling coils.
Figure 24:
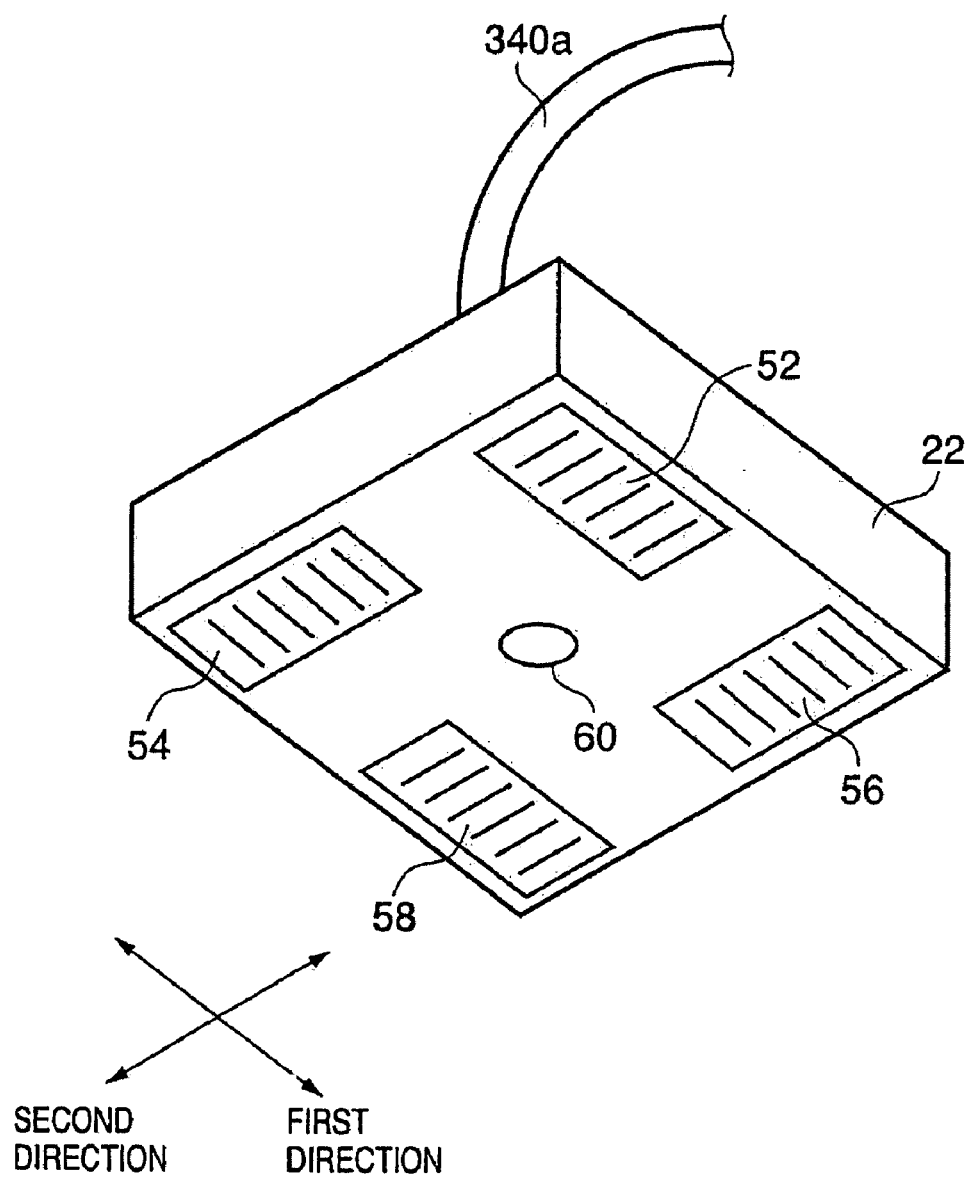
FIG. 24 is a view showing the arrangement of part of a movable element in a conventional stage mechanism.
Figure 25:
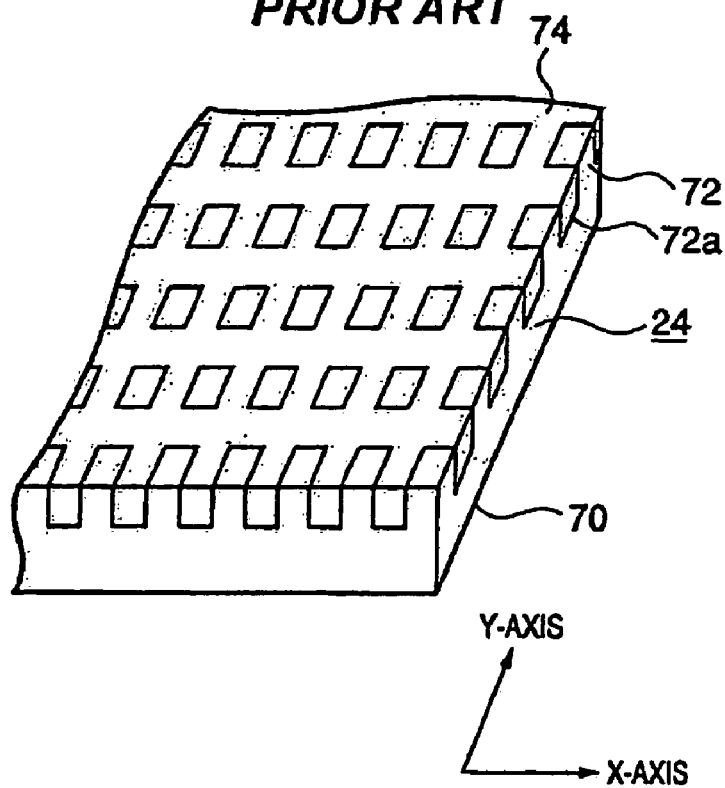
FIG. 25 is a view showing the arrangement of part of a stator in the conventional stage mechanism.
Figure 26:
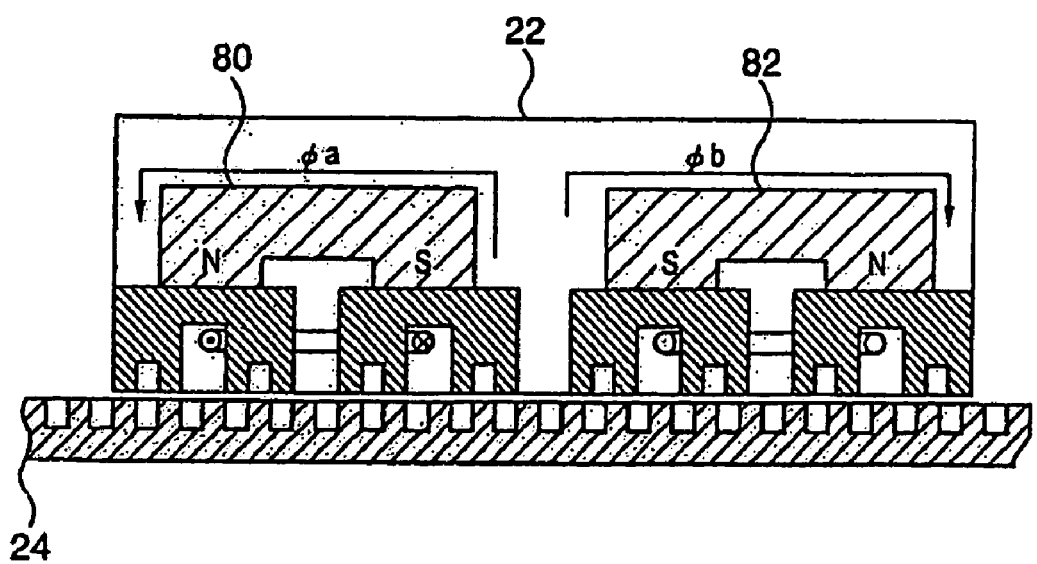
FIG. 26 is a view showing sections of the stator and movable element in the conventional stage mechanism.

FIG. 23 is a view showing the arrangement which directly cools coils through a thermal conductor 2310. Similar to the arrangement in FIG. 22, the partition 2210 with which the coil arrays 116 are enclosed and which are isolated from the base 118 is also provided. The inside of the partition 2210 is filled with the thermal conductor 2310 having high thermal conductivity. A coolant 2340 is arranged to circulate through a channel which is provided in the base 118 and extends from a coolant inlet 2320 toward a coolant outlet 2330 by a circulating system (not shown). In this arrangement, the base 118 is first cooled, and coils can indirectly be cooled by heat conduction through the thermal conductor 2310. The coil temperature in this arrangement is higher than the arrangement in FIG. 22. However, since coils and the coolant do not come in contact with each other, insulation countermeasures can easily be implemented, and countermeasures against a leak of the coolant are unnecessary. Additionally, since the partition does not receive the internal pressure of the coolant, the thickness of the partition can be reduced.

<Application to a Semiconductor Manufacturing Process>

The manufacturing process of a semiconductor device (e.g., a semiconductor chip such as an IC or LSI, a CCD, or a liquid crystal panel) using the above-mentioned exposure apparatus will be described with reference to FIG. 16B.

Figure 16B:
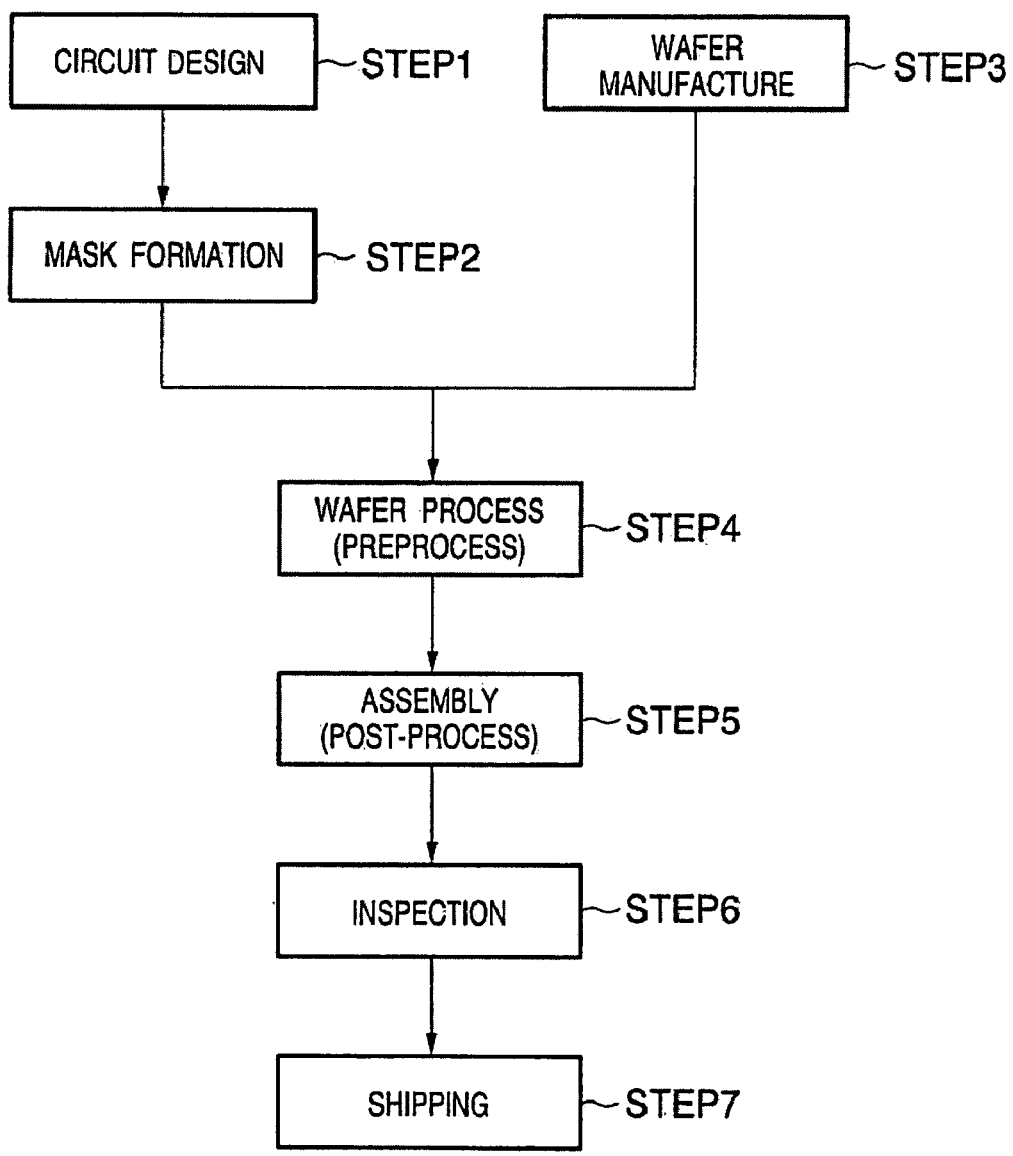
FIG. 16B is a flow chart for explaining the flow of a device manufacturing process.

FIG. 16B shows the flow of the whole manufacturing process of the semiconductor device. In step 1 (circuit design), a semiconductor device circuit is designed. In step 2, exposure control data for an exposure apparatus is created on the basis of the designed circuit pattern. In step 3 (wafer manufacture), a wafer is manufactured by using a material such as silicon. In step 4 (wafer process), called a preprocess, an actual circuit is formed on the wafer by lithography using the prepared mask and wafer. Step 5 (assembly), called a post-process, is the step of forming a semiconductor chip by using the wafer formed in step 4, and includes an assembly process (dicing an bonding) and a packaging processing (chip encapsulation). In step 6 (inspection), the semiconductor device manufactured in step 5 undergoes inspections such as an operation confirmation test and a durability test. After these steps, the semiconductor device is completed and shipped (step 7).

The wafer process in step 4 comprises the following steps. More specifically, the wafer process includes an oxidation step of oxidizing the wafer surface, a CVD step of forming an insulating film on the wafer surface, an electrode formation step of forming an electrode on the wafer by vapor deposition, an ion implantation step of implanting ions in the wafer, a resist processing step of applying a photosensitive agent to the wafer, an exposure step of transferring the circuit pattern onto the wafer having undergone the resist processing step using the above-mentioned exposure apparatus, a development step of developing the wafer exposed in the exposure step, an etching step of etching a portion except for the resist image developed in the development step, and a resist removal step of removing an unnecessary resist after etching. These steps are repeated to form multiple circuit patterns on the wafer.

With the above-mentioned exposure apparatus, the exposure accuracy and the throughput of the apparatus can be increased. This can increase the productivity of semiconductor devices compared to the prior art.

As has been described above, the present invention can generate thrusts and moments in directions with six degrees of freedom and eliminates the need for guiding power cables. This can provide an alignment apparatus which does not use the air pressure to levitate a movable element.

Alternatively, disturbance caused by guiding power cables can be eliminated, thereby allowing high-accuracy alignment in six axial directions.

Alternatively, to arrange magnets on a movable element, ones which generate a translational driving force and the remaining ones which generate a rotational driving force in a projecting region of the movable element are separately arranged. This can reduce the amount of heat generated in coils upon driving of the movable element.

As many apparently widely different embodiments of the present invention can be made without departing from the spirit and scope thereof, it is to be understood that the invention is not limited to the specific embodiments thereof except as defined in the claims.

What is claimed is:

1. An alignment apparatus comprising:
   a movable element having a plurality of permanent magnets which are two-dimensionally arranged;
   a stator having a plurality of coils which face said movable element;
   a controller which controls currents supplied to the plurality of coils, wherein the plurality of permanent magnets are arranged in a central square region and a projecting region projected from the central square region, and
   wherein a force used for driving said movable element in a rotational direction is generated by applying currents to coils which face the plurality of permanent magnets disposed in the projection region.

2. The apparatus according to claim 1, wherein the coils are formed by stacking a plurality of first layers and a plurality of second layers,
   each of the first layers comprising coils whose linear portions are arranged to extend in a first direction, and
   each of the second layers comprising coils whose linear portions are arranged to extend in a second direction perpendicular to the first direction.

3. The apparatus according to claim 2, wherein the coil which constitutes one of the first and second layers generates a driving force with one degree of freedom between the magnet and the coil facing the magnet on the basis of the current.

4. The apparatus according to claim 2, wherein said controller supplies currents having different polarities to the coils which constitute one of the first and second layers to generate translational and rotational driving forces with two degrees of freedom between the magnets and the coils facing the magnets.

5. The apparatus according to claim 1, wherein the coils formed by stacking three pairs of the first and second layers generate translational driving forces with three degrees of freedom and rotational driving forces with three degrees of freedom between the magnets and the coils of each layer facing the magnets on the basis of the currents.

6. The apparatus according to claim 1, wherein an array of the magnets includes a plurality of defective portions which have no magnets.

7. The apparatus according to claim 1, wherein the plurality of permanent magnets are asymmetrically arranged to a line passing through a center of gravity of said movable element, the line being a parallel line in the moving direction of said movable element.

8. The apparatus according to claim 1, wherein said controller supplies the currents to the coils for generating translational driving forces between the magnets arrayed in the first region and the coils facing the magnets to control a position of said movable element.

9. The apparatus according to claim 1, wherein said controller supplies the currents to the coils for generating rotational driving forces between the magnets arrayed in the projecting regions and the coils facing the magnets to control a posture of said movable element.

10. The apparatus according to claim 1, further comprising a first partition structure which covers the coils and in which a coolant for cooling the coils can circulate.

11. The apparatus according to claim 1, further comprising:
   first cooling means in which a coolant can circulate; and
   second cooling means for transmitting heat of cooling of the coolant to the coils through a thermal conductor with which said second cooling means is filled to cool the coils.

12. An alignment apparatus comprising:
   a movable element having a plurality of permanent magnets which are two-dimensionally arranged;
   a stator having a plurality of coils which face said movable element; and
   a controller which controls currents supplied to the plurality of coils,
   wherein the plurality of permanent magnets are arranged in a central square region of said movable element, and
   wherein a force used for driving said movable element in a rotational direction is generated by applying currents to coils which face a defective region, which is formed by eliminating magnets from the central square region.

* * * * *

UNITED STATES PATENT AND TRADEMARK OFFICE
CERTIFICATE OF CORRECTION

PATENT NO. : 7,075,198 B2 Page 1 of 1
APPLICATION NO. : 11/178568
DATED : July 11, 2006
INVENTOR(S) : Nobushige Korenaga It is certified that error appears in the above-identified patent and that said Letters Patent is hereby corrected as shown below:

COLUMN 4:
Line 31, "co z direction" should read -- $\omega z$ direction --.

COLUMN 7:
Line 36, "the$\pm Y$" should read -- the $\pm Y$ --.

Signed and Sealed this

Second Day of January, 2007

JON W. DUDAS
*Director of the United States Patent and Trademark Office*